(12) United States Patent
Muramatsu et al.

(10) Patent No.: US 7,754,619 B2
(45) Date of Patent: Jul. 13, 2010

(54) METHOD FOR FORMING A COATING WITH A LIQUID, AND METHOD FOR MANUFACTURING A SEMICONDUCTOR DEVICE

(75) Inventors: Tomoaki Muramatsu, Kawasaki (JP); Yuko Kaimoto, Kawasaki (JP); Ichiro Omata, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 321 days.

(21) Appl. No.: 11/772,638

(22) Filed: Jul. 2, 2007

(65) Prior Publication Data

US 2008/0176410 A1  Jul. 24, 2008

(30) Foreign Application Priority Data

Jan. 19, 2007  (JP) .............................. 2007-010293

(51) Int. Cl.
- H01L 21/312 (2006.01)
- H01L 21/47 (2006.01)
- B05D 3/12 (2006.01)
- B05D 5/12 (2006.01)

(52) U.S. Cl. .................. 438/780; 438/782; 427/240
(58) Field of Classification Search .......... 438/780, 438/782; 427/240
See application file for complete search history.

(56) References Cited

U.S. PATENT DOCUMENTS

| | | | |
|---|---|---|---|
| 4,518,678 A | 5/1985 | Allen | |
| 5,405,813 A | 4/1995 | Rodrigues | |
| 5,780,105 A | 7/1998 | Wang | |
| 5,912,049 A * | 6/1999 | Shirley | 427/240 |
| 5,968,592 A | 10/1999 | Yoshida et al. | |
| 6,117,486 A | 9/2000 | Yoshihara | |
| 6,171,401 B1 * | 1/2001 | Shirley | 118/696 |
| 6,317,642 B1 * | 11/2001 | You et al. | 700/121 |
| 6,387,825 B2 * | 5/2002 | You et al. | 438/782 |
| 6,402,845 B1 * | 6/2002 | Shirley | 118/679 |
| 6,440,218 B1 | 8/2002 | Sanada et al. | |
| 6,548,110 B1 * | 4/2003 | Shirley | 427/240 |
| 6,793,836 B2 | 9/2004 | Tsung-Kuei et al. | |
| 6,890,595 B2 * | 5/2005 | Lee et al. | 427/240 |
| 7,384,878 B2 | 6/2008 | DeMuynck et al. | |
| 2003/0196986 A1 | 10/2003 | Tsung-Kuei et al. | |
| 2006/0003468 A1 | 1/2006 | DeMuynck et al. | |

(Continued)

FOREIGN PATENT DOCUMENTS

EP  07111688.3  9/2009

(Continued)

*Primary Examiner*—Mary Wilczewski
(74) *Attorney, Agent, or Firm*—Orrick, Herrington & Sutcliffe LLP

(57) ABSTRACT

A method of forming a liquid coating on a substrate that reduces the amount of consumption of the coating liquid and achieves a more even distribution of the thickness of the liquid coating film. The method may include supplying a solvent to a surface of a substrate, starting a supply of a coating liquid to the surface of the substrate while rotating the substrate at a first rotation speed, stopping a rotation of the substrate by decelerating the rotation of the substrate at a deceleration larger than 30000 rpm/sec at a point of time when the supply of the coating liquid is stopped, and then rotating the substrate at a second rotation speed. Accordingly, the dispense amount of the coating liquid is reduced and the film thickness of the coating liquid is flatten.

39 Claims, 18 Drawing Sheets

U.S. PATENT DOCUMENTS

| | | |
|---|---|---|
| 2007/0020561 A1* | 1/2007 | Hisada et al. ........... 430/270.11 |
| 2007/0092642 A1 | 4/2007 | Yoshihara et al. |
| 2007/0092643 A1* | 4/2007 | Yoshihara et al. ........... 427/240 |
| 2008/0069948 A1* | 3/2008 | Yoshihara et al. ........... 427/240 |
| 2008/0190361 A1 | 8/2008 | DeMuynck et al. |

FOREIGN PATENT DOCUMENTS

| | | |
|---|---|---|
| JP | 59106120 | 6/1984 |
| JP | 63-313160 | 12/1988 |
| JP | 08107062 | 4/1996 |
| JP | 09 007930 | 1/1997 |
| JP | 09 129549 | 5/1997 |
| JP | 10 022220 | 1/1998 |
| JP | 03 504444 | 4/1998 |
| JP | 10-275761 | 10/1998 |
| JP | 11-260717 | 9/1999 |
| JP | 2000-157922 | 6/2000 |
| JP | 2007-115936 | 5/2007 |
| KR | 10-20070043655 A | 4/2007 |

* cited by examiner $\alpha_1$ : DECELERATION, $T_0$, $T_{11}$, $T_{12}$ : TIME PERIOD
$R_{11}$, $R_{12}$ : ROTATION SPEED $\alpha_2$: DECELERATION, $T_{21}$, $T_{22}$, $T_{23}$: TIME PERIOD $R_{21}$, $R_{22}$, $R_{23}$ : ROTATION SPEED

FIG.9A

RESIST VISCOSITY: ABOUT 40 mPa·s

| ROTATION SPEED AFTER THE FIRST ROTATION | $\alpha_1$ rpm/sec | | AMOUNT OF THE RESIST DROP 3.0ml | | | | |
|---|---|---|---|---|---|---|---|
| | | | ×100% 3.0ml | ×90% 2.7ml | ×80% 2.4ml | ×70% 2.1ml | ×50% 1.5ml |
| 0 rpm | 25k | σ | 3.70 | | | | |
| | | range | 20.7 | | | | |
| | 30k | σ | | 5.6 | 4.2 | 5.2 | 9.8 |
| | | range | | 21.2 | 18.1 | 21.3 | 39.9 |
| | 40k | σ | | 2.0 | 2.4 | 3.0 | 8.4 |
| | | range | | 9.5 | 13.9 | 12.4 | 24.9 |
| | 50k | σ | 2.3 | 2.6 | 2.4 | 3.5 | |
| | | range | 11.8 | 12.9 | 12.8 | 13.0 | |

σ : STANDARD DEVIATION (I-LINE RESIST)
range : RANGE BETWEEN THE MAXIMUM AND MINIMUM OF THE FILM THICKNESS (nm)

 CONDITION FOR MAKING BETTER FLATNESS THAN REFERENCE

FIG.9B

RESIST VISCOSITY: ABOUT 40 mPa·s

| $R_{22}$ | $\alpha_2$ rpm/sec | | AMOUNT OF THE RESIST DROP 3.0ml | | | | |
|---|---|---|---|---|---|---|---|
| | | | ×100% 3.0ml | ×90% 2.7ml | ×80% 2.4ml | ×70% 2.1ml | ×50% 1.5ml |
| 100 rpm | 25k | σ | 3.1 | | | | |
| | | range | 15.2 | | | | |
| | 30k | σ | 2.7 | 3.1 | 3.1 | 4.1 | 8.8 |
| | | range | 15.1 | 11.1 | 10.7 | 12.1 | 26.6 |
| | 40k | σ | 2.8 | 3.6 | 3.5 | 4.6 | 9.8 |
| | | range | 13.5 | 14.4 | 15.4 | 17.4 | 29.8 |
| | 50k | σ | 3.3 | 3.4 | 3.3 | 4.8 | |
| | | range | 16.5 | 16.4 | 17.1 | 22.5 | |

σ : STANDARD DEVIATION (I-LINE RESIST)
range : RANGE BETWEEN THE MAXIMUM AND MINIMUM OF THE FILM THICKNESS (nm)

FIG.12A

RESIST VISCOSITY: ABOUT 15 mPa·s

| ROTATION SPEED AFTER THE FIRST ROTATION | $\alpha_1$ rpm/sec | | AMOUNT OF THE RESIST DROP 1.0ml | | | | |
|---|---|---|---|---|---|---|---|
| | | | ×100% 1.0ml | ×90% 0.9ml | ×80% 0.8ml | ×70% 0.7ml | ×50% 0.5ml |
| 0 rpm | 30k | σ | | 2.04 | 2.35 | 2.99 | 3.61 |
| | | range | | 6.64 | 7.60 | 9.36 | 10.44 |
| | 40k | σ | | 1.36 | 2.26 | 2.79 | 3.77 |
| | | range | | 4.65 | 7.70 | 8.78 | 12.46 |
| | 50k | σ | 0.89 | 0.94 | 1.82 | 2.31 | |
| | | range | 3.13 | 3.68 | 6.47 | 7.47 | |

σ : STANDARD DEVIATION     (KrF RESIST)
range: RANGE BETWEEN THE MAXIMUM AND MINIMUM OF THE FILM THICKNESS (nm)

 CONDITION FOR MAKING AS WELL OR BETTER FLATNESS THAN REFERENCE

FIG.12B

RESIST VISCOSITY: ABOUT 15 mPa·s

| | | | AMOUNT OF THE RESIST DROP |
|---|---|---|---|
| $R_{22}$ | $\alpha_2$ rpm/sec | | 1.0ml |
| 100 rpm | 50k | σ | 1.31 |
| | | range | 4.44 |

(KrF RESIST)

σ : STANDARD DEVIATION
range: RANGE BETWEEN THE MAXIMUM AND MINIMUM OF THE FILM THICKNESS (nm)

REFERENCE: SECOND ROTATION SPEED = 100 rpm
DECELERATION = 30000 rpm/sec, DISCHARGE TIME FIXED REFERENCE: SECOND ROTATION SPEED = 100 rpm
DECELERATION = 40000 rpm/sec, DISCHARGE TIME FIXED

FIG.17A

RESIST VISCOSITY: ABOUT 2 mPa·s

| ROTATION SPEED AFTER THE FIRST ROTATION | $\alpha_1$ rpm/sec | | AMOUNT OF THE RESIST DROP 1.0ml | | | | |
|---|---|---|---|---|---|---|---|
| | | | ×100% 1.0ml | ×90% 0.9ml | ×80% 0.8ml | ×70% 0.7ml | ×50% 0.5ml |
| 0 rpm | 30k | σ | | 0.47 | 0.42 | 0.53 | 0.70 |
| | | range | | 1.74 | 1.60 | 2.11 | 2.50 |
| | 40k | σ | | 0.41 | 0.35 | 0.33 | 0.63 |
| | | range | | 1.36 | 1.33 | 1.23 | 2.23 |
| | 50k | σ | 0.35 | 0.29 | 0.50 | 0.62 | |
| | | range | 1.17 | 1.08 | 1.78 | 3.80 | |

σ: STANDARD DEVIATION (ArF RESIST)
range: RANGE BETWEEN THE MAXIMUM AND MINIMUM OF THE FILM THICKNESS (nm)

☐ CONDITION FOR MAKING AS WELL OR BETTER FLATNESS THAN REFERENCE

FIG.17B

RESIST VISCOSITY: ABOUT 2 mPa·s

| | | | AMOUNT OF THE RESIST DROP |
|---|---|---|---|
| $R_{22}$ | $\alpha_2$ rpm/sec | | 1.0ml |
| 100 rpm | 50k | σ | 0.41 |
| | | range | 1.25 |

(ArF RESIST)

σ: STANDARD DEVIATION
range: RANGE BETWEEN THE MAXIMUM AND MINIMUM OF THE FILM THICKNESS (nm)

$\alpha_1$: DECELERATION, $T_0$, $T_{111}$, $T_{112}$, $T_{12}$: TIME PRIOD $R_{10}$, $R_{11}$, $R_{12}$: ROTATION SPEED

METHOD FOR FORMING A COATING WITH A LIQUID, AND METHOD FOR MANUFACTURING A SEMICONDUCTOR DEVICE

CROSS-RELATED APPLICATION

This application claims priority to Japanese Patent Application 2007-010293, filed Jan. 19, 2007, and is fully incorporated herein by reference.

FIELD OF THE INVENTION

The present invention relates to a method for a forming coating with a liquid, and a method for manufacturing a semiconductor device and, more particularly, a method for forming a coating with a liquid such as resist, spin on glass (SOG), polyimide, or the like over a substrate such as a semiconductor substrate, photomask, liquid crystal display (LCD) substrate, or the like, and a method for a manufacturing semiconductor device having a step of coating a coating liquid over a substrate.

BACKGROUND OF THE INVENTION

For example, in the process for manufacturing a semiconductor device made of a semiconductor substrate such as silicon, gallium arsenide, or the like, multiple step operations are carried out for patterning the film, such as insulating film, semiconductor film, metal film, or the like, which is formed over the substrate, are carried out. Such film patterning is executed by forming resist patterns over the film as a mask, and then etching the film in areas that are not covered by the resist.

The resist patterns are formed through the processes of baking, exposure, development, and the like after the resist is coated over the substrate on which the film is formed. The coating of the resist is carried out by dispensing a liquid resist over the substrate, and spreading the liquid resist over an overall surface of the substrate by relying on the centrifugal force of rotation of the substrate and the wetting properties of the resist.

Japanese Patent Application (KOKAI) Sho-63-313160-A, Japanese Patent Application Publication (KOKAI) Hei-10-275761-A, and Japanese Patent Application Publication (KOKAI) Hei-11-260717-A disclose that the rotation speed should be changed in two or three stages, when the resist is spread over the substrate by placing resist over a rotating substrate.

Sho-63-313160-A discloses that a spin speed of a square-shaped substrate should be divided into two stages such that in the first stage, the number of rotations $R_1$ is held for a time period $T_1$, and then in the second stage, the number of rotations $R_2$ is held for a time period $T_2$, during the coating of the resist over the square-shaped substrate. The conditions of $R_1$, $R_2$ and $T_1$ are set as $R_1 \leqq 2000$ rpm, $R_2 \leqq 1,000$ rpm, $R_1 > R_2$, and $R_1 \times T_1 \leqq 10,000$ rpm·sec.

The reason why the number of rotations $R_1$ in the first stage is set to 2,000 rpm or less is to prevent the drying of the resist liquid that was dispensed onto the substrate. The reason why the number of rotations $R_2$ in the second stage is set to 1,000 rpm or less is to reduce the resulting variation in the thickness of the resist film at the edge of the square-shaped substrate and the thickness of the resist film at the center portion of the square-shaped substrate. In this case, $T_1$ in the time required to accelerate and decelerate of the substrate during the first stage.

The conditions are same as above whether stopping or continuing the rotation of the square-shaped substrate during the first stage and the second stage.

In contrast, Hei-10-275761-A and Hei-11-260717-A set forth that the first rotation speed of the semiconductor wafer as a substrate onto which the resist is dispensed should be set to 3500 rpm or 4500 rpm respectively. Also, in the resist coating method employing such a first a rotation speed, the rotation speed of the semiconductor wafer should be changed successively in three stages as described in Hei-10-275761-A and Hei-11-260717-A.

Hei-10-275761-A sets forth that (i) the resist liquid should be dispensed onto a semiconductor wafer that is being rotated at a first rotation speed of 4500 rpm, (ii) then the rotation speed of the substrate should be reduced to a the second rotation speed immediately after stopping the dispensing of the resist, (iii) then this second rotation speed should be maintained for a predetermined time, and (iv) then the rotation speed should be increased to a third rotation speed in a range between the first rotation speed and the second rotation speed. Accordingly, the resist can be coated uniformly onto the substrate without leaving a wave pattern, or the like, over the semiconductor wafer surface, according to description of Hei-10-272761-A.

Also, Hei-11-260717-A sets forth a resist liquid coating method where a liquid agent such as a thinner, or the like, is dispensed onto the surface of a semiconductor wafer before the semiconductor wafer is rotated at a first rotation speed. Accordingly, the amount of resist liquid to be dispensed can be reduced and also the thickness of the resulting resist coating can be controlled uniformly, according to the description of Hei-11-260717-A.

Also, Hei-11-260717-A sets forth that a thinner should be dispensed over the semiconductor wafer before the resist is dropped onto the semiconductor wafer, the semiconductor wafer should then be rotated at 2,000 rpm for one second, the resist liquid then should be dispensed over the semiconductor wafer during the time at which the rotation of the semiconductor wafer is increased up to 3500 rpm, and then the rotation should be reduced to 2,000 rpm or 100 rpm. Here, FIGS. 11 and 12 of Hei-11-260717 compares the case in which the amount of liquid that is dispensed is set to 1.5 cc with the case in which the amount of dispensed resist liquid is 0.5 cc.

The case where the amount of dispensation of the resist liquid is set to 1.5 cc and the rotation speed of the semiconductor wafer is reduced to 2,000 rpm after the resist is dispensed is compared with the case where the amount of dispensation of the resist liquid is set to 0.5 cc and the rotation speed is reduced to 100 rpm after the resist is dispensed, with reference to FIGS. 11 and 12 in Hei-11-260717. In this case, the former conditions could result in better uniformity of the film thickness of the resist.

According to Hei-11-260717-A, it is appreciated that, in order to make a uniform thickness of the resist coating over the semiconductor wafer, a large amount of the resist liquid, such as 1.5 cc, should be supplied onto a semiconductor wafer rotating at 3500 rpm and then the rotation speed of the semiconductor wafer should be reduced not to about 100 rpm, but to about 2,000 rpm, which is a relatively high value after the resist liquid is dispensed.

Also, according to Hei-11-260717-A, in a first case where the amount of the resist liquid being supplied is reduced to 0.5 cc, when the rotation speed of the semiconductor wafer is reduced to 100 rpm after the resist liquid is dispensed, flatness of the resist film can be improved to some extent as compared to a second case where the rotation speed is reduced to 2,000 rpm. However, the flatness of the resulting resist of the first case is considerably inferior as compared to the case where the amount of dispensation of the resist is set to 1.5 cc.

Even though variations in the thickness of the resist coating resulting from dispensing 1.5 cc of the resist liquid can be reduced, the centrifugal force scatters more of the resist liquid off the semiconductor wafer than the resist liquid remaining over the semiconductor wafer. For example, FIG. 11 of Hei-11-260717 provides an example where 1.5 cc of resist liquid is applied to an 8-inch wafer, resulting in resist film having a relatively uniform thickness of about 7340 to 7360 Angstrom. Thus, the resist liquid scattered off the substrate is not used to coat the resist film again.

There is a need for an improved method of coating a substrate with a coating liquid such as resist, SOG, polyimide, or the like by rotating the substrate such that the coating liquid is spread over the substrate in a uniform thickness.

SUMMARY OF THE INVENTION

An exemplary embodiment of the improved method includes the steps of dispensing a solvent onto a substrate, dispensing a coating liquid onto the substrate while rotating the substrate at a first rotation speed, stopping the dispensing of the coating liquid, and stopping the rotation of the substrate by decelerating the rotation at a rate more than 30000 rpm/sec.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The accompanying drawings, which are included as part of the present specification, illustrate the preferred embodiments of the present invention, and together with the general description given above and the detailed description of the preferred embodiment given below, serve to explain and teach the principles of the present invention. The components in the drawings are not necessarily to scale, emphasis instead being placed upon illustrating the principles of the invention. In the drawings, reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

FIG. 9A is a chart showing the flatness of the i-line resist film coated by the method for forming a coating with a coating liquid using the timing chart shown in FIG. 3, and FIG. 9B is a chart showing the flatness of the i-line resist film coated by the coating liquid method using the timing chart shown in FIG. 6;

FIG. 12A is a chart showing the flatness of a KrF resist film formed by a method for forming a coating with a coating liquid according to the timing chart shown in FIG. 3, and FIG. 12B is a chart showing the flatness of a KrF resist film formed by a method for forming a coating with a coating liquid according to the timing chart shown in FIG. 6;

FIG. 17A is a chart showing the flatness of an ArF resist film formed by a method for forming a coating with a coating liquid using the timing chart shown in FIG. 3, and FIG. 17B is a chart showing the flatness of an ArF resist film formed by a method for forming a coating with a coating liquid using the timing chart shown in FIG. 6;

DESCRIPTION OF THE PREFERRED EMBODIMENTS

Embodiments of the present invention will be explained in detail with reference to the drawings hereinafter. In the following description, for purposes of explanation, specific nomenclature is set forth to provide a thorough understanding of the various inventive concepts disclosed herein. However, it will be apparent to those skilled in the art that these specific details may not be required in order to practice the various inventive concepts disclosed herein.

The inventors describe a method of coating a substrate with a coating liquid that is capable of forming a coating film having a uniform thickness over a substrate while reducing the amount of consumption of the coating liquid, such as a resist or the like, and a method of manufacturing a semiconductor device using such a step of coating.

According to the above method, the flatness of the coated liquid can be improved and the amount of consumption of the coating liquid can be reduced as compared to the conventional method. In particular, in the example of a resist coating, by improving the flatness of the resist, the precision of exposing the resist can be enhanced and in turn the precision of the patterning of the resist can be improved.

Figure 1:
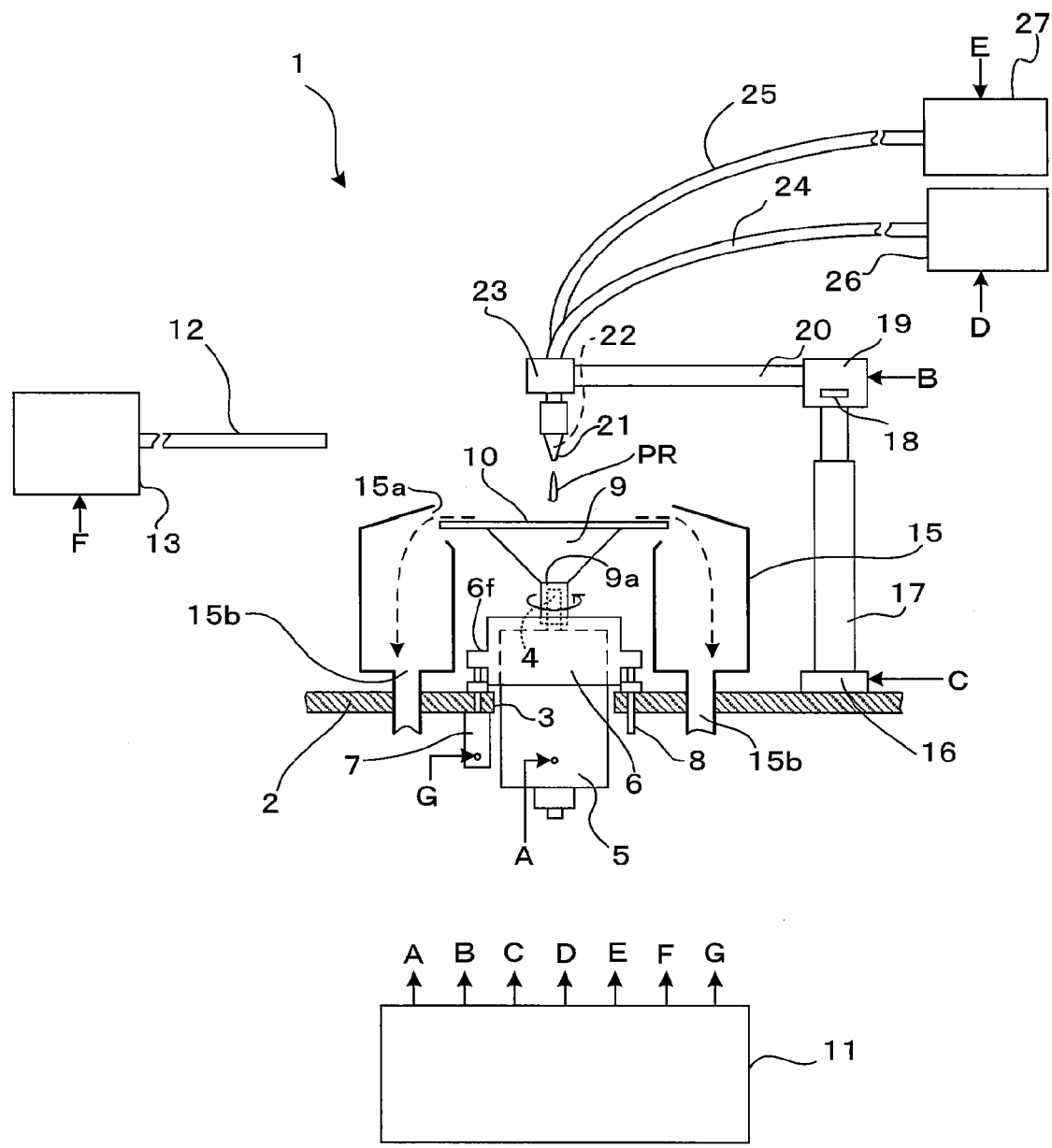
FIG. 1 is a side view showing an example of a coating unit that may be used in an improved method of applying a coating liquid according to an embodiment of the present invention.
Figure 2:
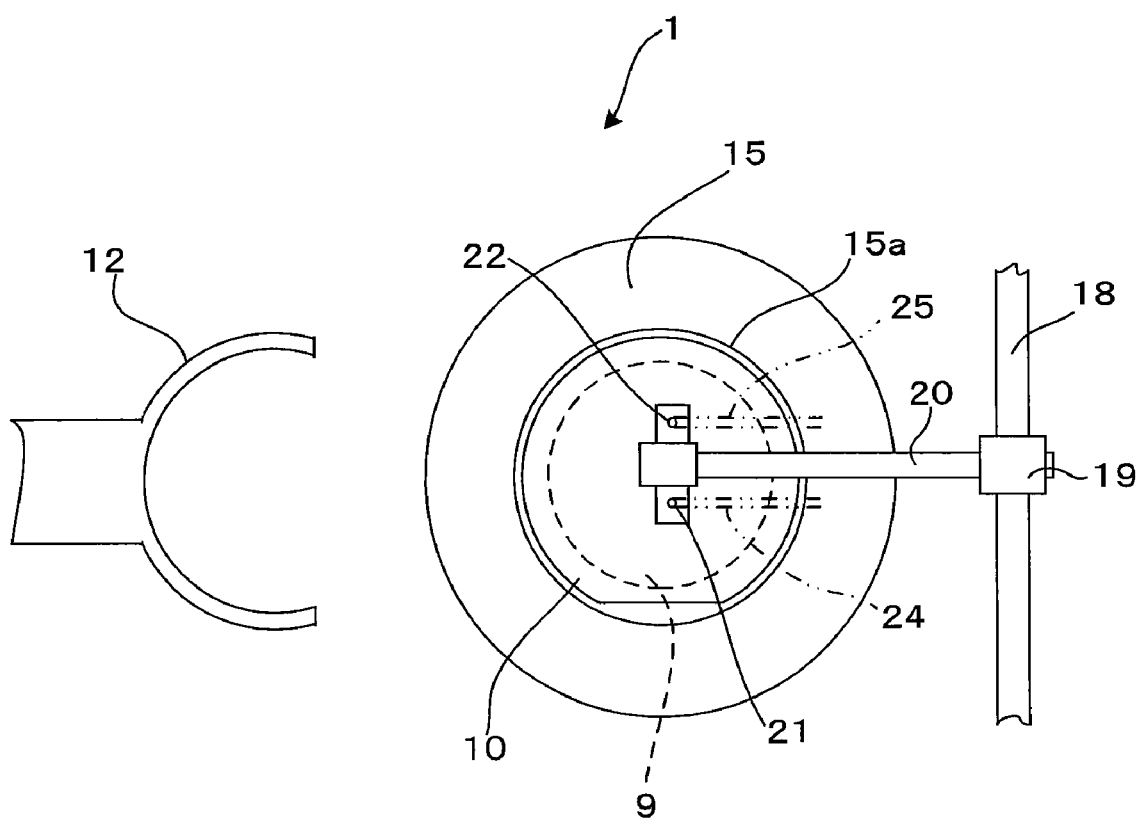
FIG. 2 is a plan view showing an example of a coating unit that may be used in the improved coating liquid method according to the embodiment of an present invention.

FIGS. 1 and 2 are a side view and a plan view respectively of an example coating unit that may used the improved method of forming a coating with a liquid, according to an embodiment of the present invention. In the preferred embodiment, a detailed explanation of the improved method will be provided with respect to the example of the coating liquid being a resist. Of course, the invention is not limited to a resist coating liquid, nor is the method limited to being practiced by the example coating unit.

As shown in FIGS. 1 and 2, a motor 5 is fitted to move vertically in an opening portion 3 provided in the center of a base plate 2 of a coating unit 1.

The upper end side of the motor 5 is covered with a cylindrical motor holding case 6. The motor holding case 6 has a closed end through which one end of a rotating shaft 4 of the motor 5 passes, and an open end that is positioned in the center of a side surface of the motor 5.

A flange 6f is provided on an outer periphery of the motor holding case 6. A lift 7 fitted to the base plate 2 is connected to the flange 6f. The lift 7 is driven/controlled by a controlling portion 11 to move integrally the flange 6f, the motor holding case 6, and the motor 5 up and down. Also, a lift guide 8 for restricting movement of the flange 6f in the lateral direction is fitted to the base plate 2.

A rotating shaft 9a of a spin chuck 9 is fixed to one end of the rotating shaft 4 of the motor 5, which passes through the motor holding case 6. Also, a rotation speed of the spin chuck 9 is controlled by the controlling portion 11 that controls the rotation of the motor 5. The controlling portion 11 may be, for example, may be a microprocessor, microcontroller, central processing unit (CPU), arithmetic logic unit (ALU), math coprocessor, floating point coprocessor, graphics coprocessor, hardware controller, programmable logic device programmed for use as a controller, or other control logic. The controlling portion 11 may be formed out of inorganic materials, organic materials, or a combination. The controlling portion 11 can include any of the processing units described in this disclosure or known to those skilled in the art of circuit design.

A substrate 10 that is loads and unloads a substrate 10, such as a semiconductor substrate, detachably onto the spin chuck 9. The substrate carrying arm 12 is driven by an arm driving portion 13 to move back and forth in the lateral direction in the coating unit 1. The moving position of the substrate carrying arm 12 by the arm driving portion 13 is controlled by the controlling portion 11.

An annular vessel 15 is arranged around the spin chuck 9, and an annular opening portion 15a is formed to surround the outer periphery of the substrate 10 set on the spin chuck 9. Waste fluid ports 15b are provided in the bottom portion of the annular vessel 15.

An arm supporting pole 17 whose height is adjusted by a lifting portion 16 is fitted to the base plate 2 in an area exterior of the annular vessel 15. A rail 18 extending in a tangential direction of the spin chuck 9, as shown in FIG. 2, is fitted to the top end of the arm supporting pole 17. An arm moving portion 19 is fitted to the rail 18. A scan arm 20 which is moved/controlled in a direction perpendicular to the rail 18 is fitted to the arm moving portion 19. A moving position of the arm moving portion 19 on the rail 18 and a moving position of the scan arm 20 moved by the arm moving portion 19 are controlled by the controlling portion 11.

A nozzle holder 23 for holding a resist nozzle 21 and a solvent nozzle 22 over the spin chuck 9 is fitted onto the top end of the scan arm 20.

A resist supply pipe 24 is connected to the top end of the resist nozzle 21, and a solvent supply pipe 25 is connected to the top end of the solvent nozzle 22. A resist supplying portion 26 for supplying a resist liquid to the resist nozzle 21 is connected to the resist supply pipe 24. Also, a solvent supplying portion 27 for supplying a solvent to the solvent nozzle 22 is connected to the solvent supply pipe 25.

A supply amount of resist from the resist supplying portion 26, i.e., an amount of resist dropped, supplied, or dispensed from the resist nozzle 21, and an amount of solvent supplied from the solvent supplying portion 27, i.e., an amount of solvent dropped, supplied, or dispensed from the solvent nozzle 22, are controlled by the controlling portion 11 respectively.

In the above coating unit 1, when the arm driving portion 13 is driven by a control signal of the controlling portion 11, the substrate 10 on the substrate carrying arm 12 is carried on the spin chuck 9. Then, when the lift 7 causes the motor 5 to move upward based on a signal from controlling portion 11, a top end of the spin chuck 9 is lifted to a position higher than the annular vessel 15. Accordingly, the spin chuck 9 receives the substrate 10 thereon and sucks it. Then, the substrate carrying arm 12 backs away from the spin chuck 9 with the arm driving portion 13. Then, the lift 7 brings the motor 5 down via the motor holding case 6 until the substrate 10 moves to a position where the substrate is surrounded by the annular opening portion 15a of the annular vessel 15.

The retreat of the substrate carrying arm 12 by the arm driving portion 13 and the descent of the lift 7 are controlled by the control signal of the controlling portion 11.

The example embodiments of the improved method control the rotation speed of the substrate, the supplying of a solvent, and the supplying of a resist, respectively, as described below.

First Example

Figure 3:
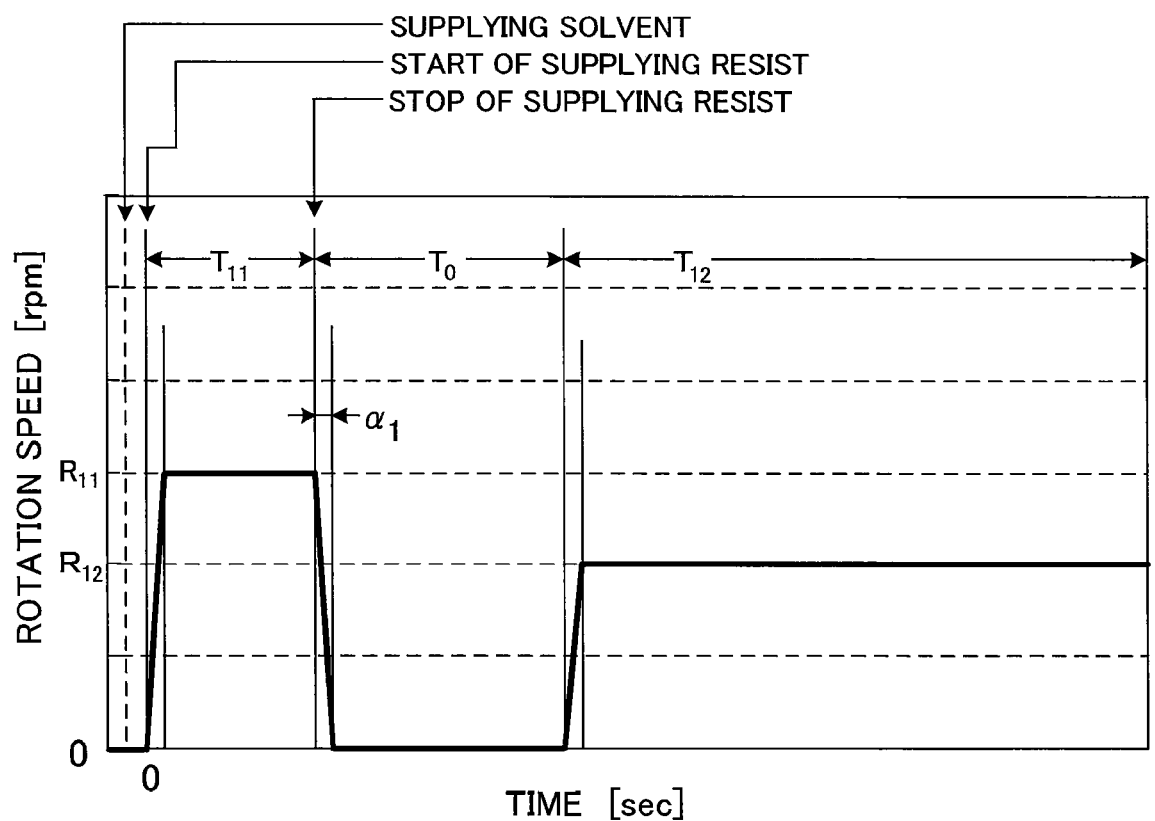
FIG. 3 is a timing chart showing example rotation speeds and time durations for rotating a substrate in the method for forming a coating with a coating liquid according to an embodiment of the present invention.

In the First Example, the following controls are applied to dispense the solvent onto the substrate 10 and coat the resist on the substrate 10 in compliance with the timing chart as shown in FIG. 3. In addition, a bare silicon substrate is used as the substrate 10.

Then, the motor 5 is rotated by the controlling portion 11 to rotate the substrate 10 at a first rotation speed $R_{11}$. At the same time, an amount of resist liquid supplied to the resist supply pipe 24 is controlled by the resist supplying portion 26 to drop the resist liquid on the center portion of the substrate 10 from the resist nozzle 21 for a time period $T_{11}$.

First, the motor 5 and the spin chuck 9 are stopped by the controlling portion 11. In this state, the solvent supplying portion 27 controls the amount of solvent supplied to the solvent supply pipe 25 and thus the solvent, a thinner for example, is dispensed onto the center portion of the substrate 10 from the solvent nozzle 22.

Then, the motor 5 is rotated by the controlling portion 11 to rotate the substrate 10 at a first rotation speed $R_{11}$. At the same time, the resist supplying portion 26 controls the amount of resist liquid supplied to the resist supply pipe 24, thereby dispensing the resist liquid out of the resist nozzle 21 onto the center portion of the substrate 10 for a time period $T_{11}$.

As an option for any of the embodiments, the first rotation speed $R_{11}$ may be changed after the supply of the coating liquid to the substrate 10 has started but before the rotation of the substrate 10 has stopped. As another option for any of the embodiments, the substrate 10 may be rotated at a rotation speed lower than the first rotation speed $R_{11}$, after supplying the thinner and before the substrate 10 is rotated at the first rotation speed $R_{11}$. In other words, instead of a ramp up in speed from zero to the first rotation speed $R_{11}$, one option is to ramp up in speed from zero to a rotation speed (not illustrated), dispensing the solvent during that rotation speed, and then ramp up again in speed from that rotation speed to the first rotation speed $R_{11}$, during which the resist is dispensed. Yet another option for any of the embodiments is to dispense the resist onto the substrate 10 before the substrate is rotating at the first rotation speed $R_{11}$.

Then at the end of time period $T_{11}$, the dispensing of the resist liquid from the resist nozzle 21 is stopped. At the same time in this First Example, the rotation of the substrate 10 is stopped by decelerating the substrate 10 at a rate larger than 30000 rpm/sec, which is achieved by controlling the rotation speed of the motor 5. Throughout this patent specification, the term "rotation speed" refers to a non-zero rotation speed.

Then, the rotation speed of the substrate 10 is increased to a second rotation speed $R_{12}$ in the same rotational direction as that of the first rotation speed $R_{11}$ after a time period $T_0$ of 0.5 to 3.0 seconds, for example, has passed from the stop operation of the substrate 10, and then this second rotation speed $R_{12}$ is held for a predetermined time period $T_{12}$. In this First Example, the motor 5 is controlled such that the second rotation speed $R_{12}$ is made lower than the first rotation speed $R_{11}$.

The second rotation speed may be larger than the first rotation speed if this is appropriate based on the value of the resist viscosity.

TABLE 1 below shows an example method based on the steps for the rotation speed, acceleration rate, elapsed time, timing of solvent supply, and timing of resist supply, when the deceleration for stopping the substrate 10 from the first rotation speed $R_{11}$ is set to larger than 30000 rpm/sec, for example 40000 rpm/sec, 50000 rpm/sec.

TABLE 1

| Step No. | Time (sec) | Rotation Speed (rpm) | Acceleration (rpm/sec) | Dispensed Liquid |
|---|---|---|---|---|
| 1 | 1.5 | 0 | | thinner |
| 2 | 1.0 | 0 | | |
| 3 | 0.1 | 1000 | 10000 | |
| 4 | 3.0 | ($R_{11}$) 2500 | 10000 | resist |
| 5 | 1.0 | 0 | -(larger than 30000) | |
| 6 | 20 | ($R_{12}$) 1900 | 10000 | |

* Resist viscosity: about 40 mPa·s

As shown in TABLE 1, at step 1, there is no rotation (0 rpm) of the substance 10, and the dispensed liquid is thinner that is dispensed for 1.5 seconds. In step 2, there is no rotation for 1 second. In step 3, the substrate 10 is rotated at an acceleration of 10000 rpm/sec, which takes 0.1 second for the substrate to spin from a stopped position to 1000 rpm. In step 4, the substrate 10 is accelerated at 10000 rpm/sec to increase its rotation speed from 1000 rpm to 2500 rpm ($R_{11}$), then kept the rotation speed of 200 rpm, during which resist is dispensed onto the substrate 10. In step 5, the substrate 10 decelerates at a rate higher than 30000 rpm per second (for example, 40000 rpm/sec or 50000 rpm/sec) so it takes one second for the substrate to stop spinning. For the sake of convenience, a positive number in the tables for acceleration refers to positive acceleration rates (i.e., to increase the speed of rotation of the substrate), while a negative value refers to deceleration rates (i.e., to decrease the speed of rotation of the substrate). When the table states that the acceleration in step 5 is "-(larger than 30000)", the negative sign means deceleration so the "-(larger than 30000)" means a deceleration of more than 30000 rpm/sec, such as 40000 rpm/sec. Finally, in step 6, the substrate 10 is accelerated at 10000 rpm/sec to reach the rotation speed of 1900 rpm ($R_{12}$), and kept 1900 rpm for a time duration of 20 seconds.

In the First Example, after step 6 in TABLE 1, a back rinse (or the like) is applied to remove the unnecessary resist on the back surface of the substrate 10. The back rinse was also applied during the operations described in other tables in this patent specification.

The resist used in First Example is an i-line resist manufactured by JSR Co. Ltd. and has a viscosity of about 40 mPa·s (millipascal seconds). This i-line resist was dispensed onto a substrate 10 having a 200 mm diameter. The amount of i-line resist that was dispensed is set to 3.0 ml typically to keep the thickness of the resulting resist film within permissible limits, with a target thickness of the i-line resist film being 3600 nm over the substrate 10 having a 200 mm diameter.

The dispensing of the thinner, the dispensing of the i-line resist, and the rotation speed of the substrate 10 were controlled in compliance with the steps shown in TABLE 1, and then the thickness distributions of the resulting resist films were measured.

Measurements of the resist film thickness were made based on data taken at 49 points separated by distance of 4 mm along a straight line passing through the center of the substrate 10 and including the center point. These measuring points were analyzed similarly in the Second and Third Examples that are explained later.

In the First Example, the deceleration for stopping the rotation of the substrate 10 after ceasing the dispensing of resist to the substrate 10 was set to 40000 rpm/sec as an example. Additionally, tests were performed where the amount of resist that was dispensed was varied: 90% (2.7 ml), 80% (2.4 ml), 70% (2.1 ml), and 50% (1.5 ml), where 3.0 ml was set to 100%. Then, the film thickness distribution of the resist film was examined for each of the various resist dispense amounts (100%, 90%, 80%, 70% and 50%), where the result is shown in FIG. 4.

Figure 4:
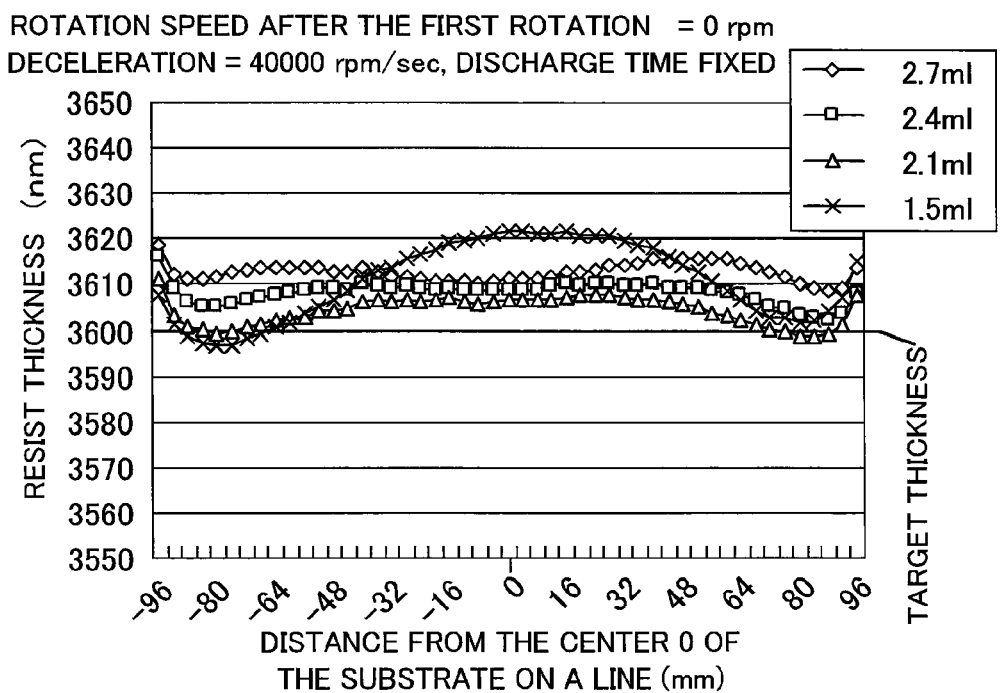
FIG. 4 is a graph showing the film thickness distributions of resist formed under the improved coating liquid method under the First Example conditions according to an embodiment of the present invention.

As shown in FIG. 4, when the dispensing amount of the resist is set to a range of 90% to 70%, the resist film in the center portion and its surroundings of the substrate 10 was thicker than the target thickness by about 10 nm or less. Therefore, the method can form an i-line resist film thickness close to the target thickness, with the optimum thickness being when the dispense amount of the i-line resist is set to 70%.

Figure 5:
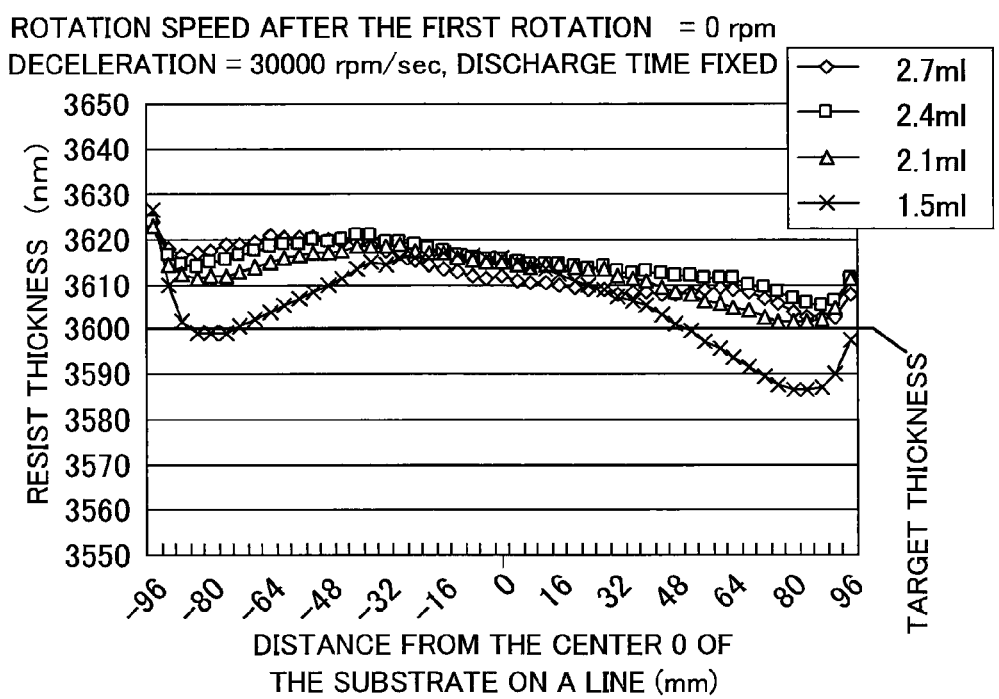
FIG. 5 is a graph showing the film thickness distributions of an i-line resist coating formed by the improved coating liquid method including a step of stopping the substrate by decelerating at 30,000 rpm/sec.

The rotation of the substrate 10 was stopped by decelerating by 30000 rpm/sec, the film thickness distributions of the resulting i-line resist film are shown in FIG. 5.

In the center portion and its nearby regions of the substrate 10, the different deceleration rates (40000 rpm/sec v. 30000 rpm/sec) resulted in some thickness differences between the resist films, as shown in FIGS. 4 and 5, where the timing chart employs a step of stopping the substrate 10 between the first rotation speed and the second rotation speed.

The thickness of the resist film measured in FIG. 4 is closer to the target thickness than that of the resist film measured in FIG. 5. Therefore, it is preferable that the deceleration rate for bringing the substrate 10 to a stop is set larger than 30000 rpm/sec.

Figure 6:
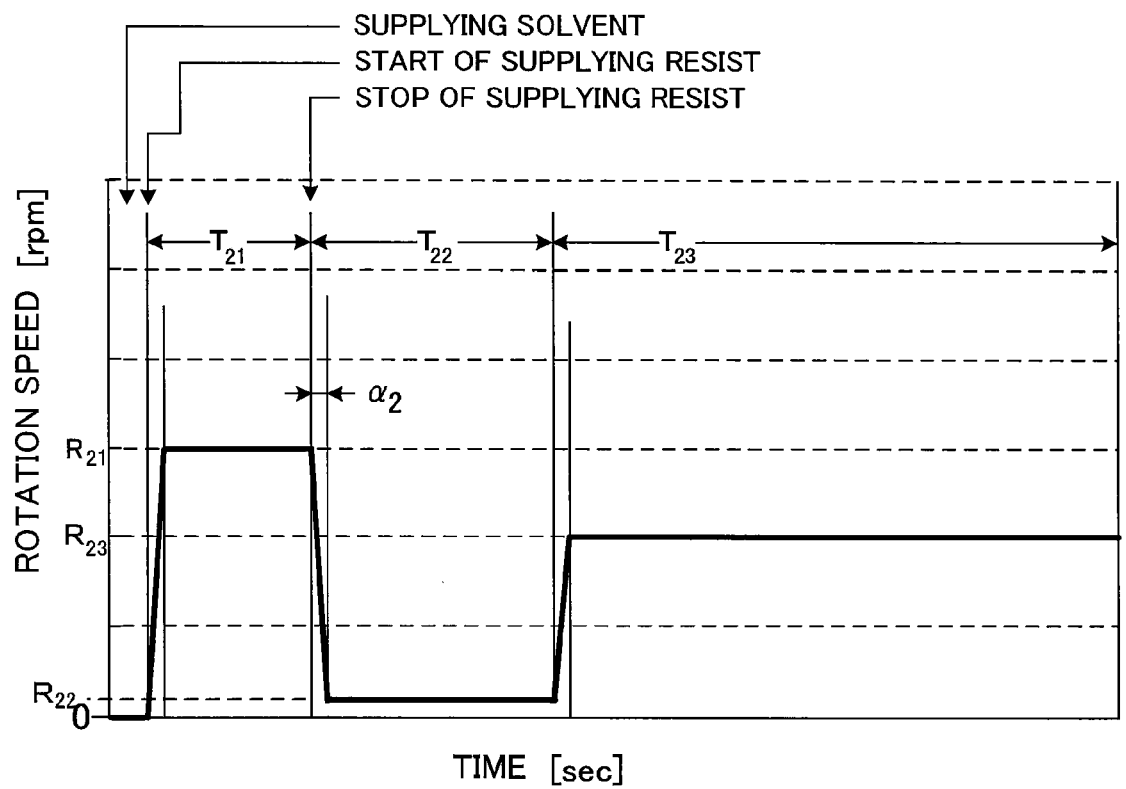
FIG. 6 is a timing chart showing example rotation speeds and time durations for rotating a substrate in a method for forming a coating with a coating liquid according to the Reference Example.

The timing chart of FIG. 6 was used to establish Reference conditions for comparison to the present embodiment of the improved method.

In FIG. 6, first the rotation of the substrate 10 is stopped. In this state, an amount of solvent supplied to the solvent supply pipe 25 is controlled by the solvent supplying portion 27, and thus the solvent, a thinner for example, is dispensed onto the center portion of the substrate 10 from the solvent nozzle 22.

Then at the start of time period $T_{21}$, the motor 5 is rotated by the controlling portion 11 to rotate the substrate 10 at a first rotation speed $R_{21}$. At the same time, the resist supplying portion 26 controls the amount of resist liquid being supplied to the resist supply pipe 24 and dispensed to the center portion of the substrate 10 from the resist nozzle 21.

Then at the end of time period $T_{21}$, the dispensing of the resist liquid from the resist nozzle 21 is ended. At the same time, the controlling portion 11 controls the rotation speed of the motor 5 to decelerate the rotation of the substrate 10 to a second rotation speed $R_{22}$ of 100 rpm at a predetermined rate of deceleration, and this second rotation speed $R_{22}$ is held for a predetermined time.

Then at the end of time period $T_{22}$, the rotation of the substrate 10 is increased up to a third rotation speed $R_{23}$ at a predetermined acceleration of 10000 rpm/sec, for example, and this third rotation speed $R_{23}$ is held for a predetermined time period $T_{23}$. Here, the third rotation speed $R_{23}$ in FIG. 6 corresponds to the second rotation speed $R_{12}$ in FIG. 3.

TABLE 2 provides Reference conditions base on an example method using the steps in TABLE 2 for the rotation speeds, acceleration rate, elapsed time, timing of solvent supply, and timing of resist supply.

TABLE 2

| Step No. | Time (sec) | Rotation Speed (rpm) | Acceleration (rpm/sec) | Dispensed Liquid |
|---|---|---|---|---|
| 1 | 1.5 | 0 | | thinner |
| 2 | 1.0 | 0 | | |
| 3 | 0.1 | 1000 | 10000 | |
| 4 | 3.0 | ($R_{21}$) 2500 | 10000 | resist |
| 5 | 1.0 | ($R_{22}$) 100 | -(25000 to 40000) | |
| 6 | 20 | ($R_{23}$) 1900 | 10000 | |

* Resist viscosity: about 40 mPa · s

Experimental variations were made to the acceleration rate in the timing chart for Reference conditions shown in TABLE 2. In particular, the acceleration rate in step 5 was set to 25000 rpm/sec, 30000 rpm/sec and 40000 rpm/sec in three test cases respectively, when the rotation speed of the substrate 10 was decelerated from the first rotation speed $R_{21}$ to the second rotation speed $R_{22}$, i.e., 100 rpm. Hence, the acceleration entry of "25000 to 40000" in TABLE 2 refers to the test rates of 25000, 30000 and 40000. Likewise, experiments were conducted by varying the dispense amount of the resist; more specifically, the dispense amounts of the resist were analyzed at 90% (2.7 ml), 80% (2.4 ml), 70% (2.1 ml), and 50% (1.5 ml), where 3.0 ml was set to 100%. Then, the film thickness distribution of the resulting resist was examined in each of these test cases, the results of which are shown in FIGS. 7 and 8.

Figure 7:
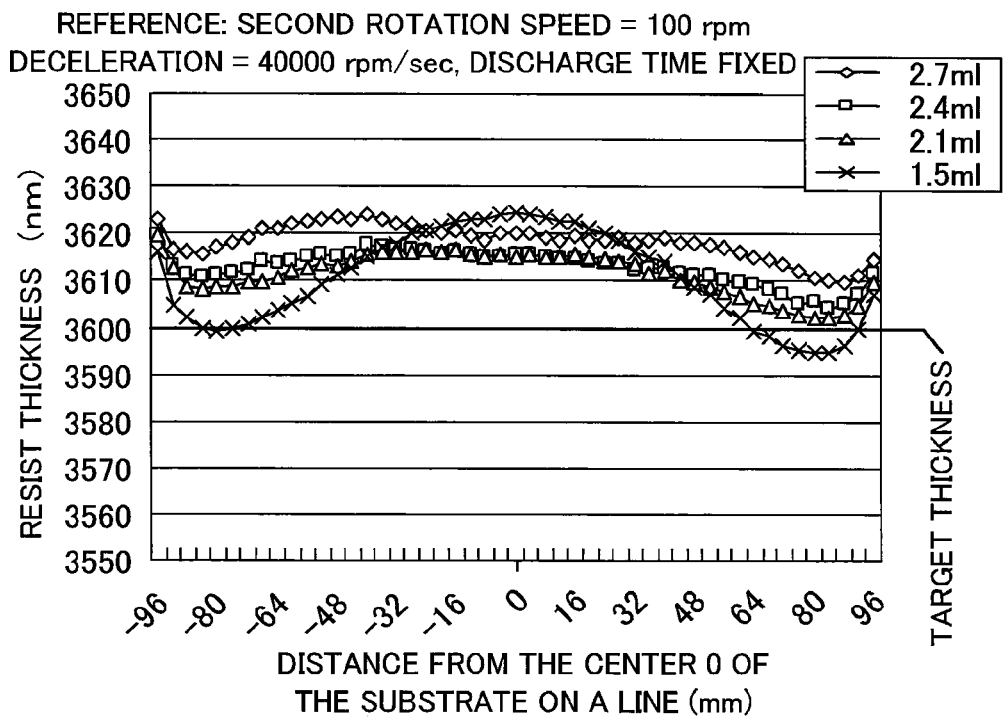
FIG. 7 is a graph showing first film thickness distributions of an i-line resist coated by the method for forming the resist with a coating liquid using the timing chart of FIG. 6.
Figure 8:
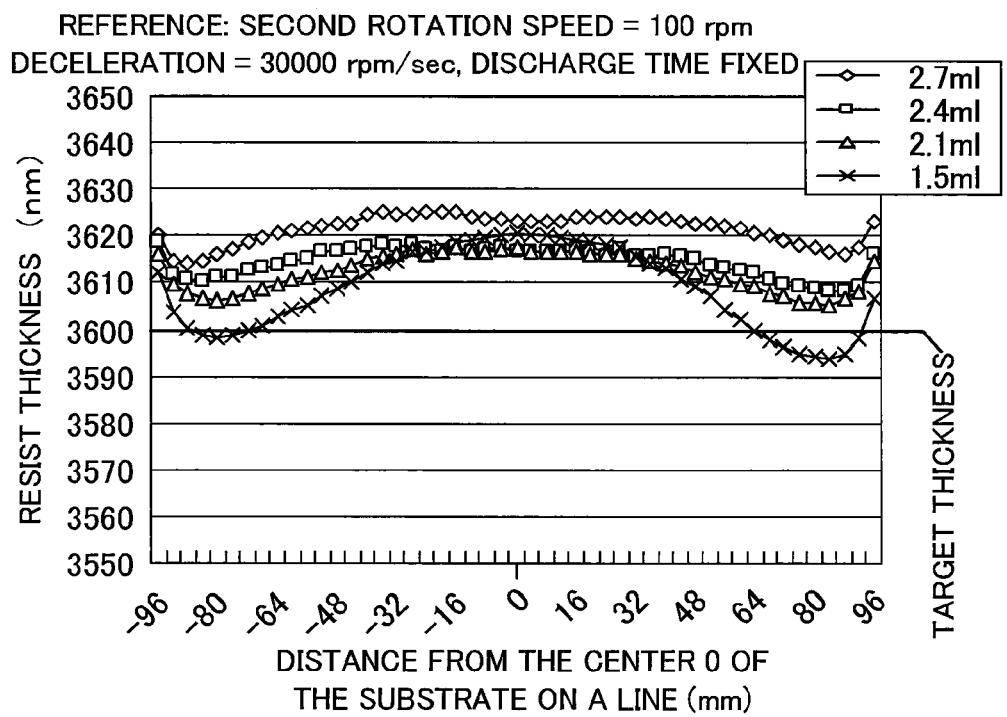
FIG. 8 is a graph showing second film thickness distributions of the i-line resist coated by the method for forming the resist with a coating liquid using the timing chart of FIG. 6.

In the center portion and its surrounding areas of the substrate 10, the resist film thicknesses formed under the Reference conditions of TABLE 2 shown in FIGS. 7 and 8 are quite far off the target film thickness as compared with the resist film thicknesses formed by the embodiment of the improved method as shown in FIG. 4. Therefore, the film thickness of the resist formed by the step of stopping rotation of the substrate 10 after the first rotation speed (see e.g., FIG. 4) is closer to the target film thickness than the film thickness of the resist formed when the rotation of the substrate 10 is not stopped (see e.g., FIG. 7).

The film thickness distributions were further examined in compliance with the above steps shown in TABLES 1 and 2 while varying the dispense amount of the resist, and while varying the acceleration of the substrate after the end of dispensing of the resist, respectively. Then, when a standard deviation σ and a range, i.e., between the maximum value and the minimum value of the film thicknesses (in other words, a range of the film thicknesses), in the film thickness distribution were derived, the results shown in FIGS. 9A and 9B were obtained.

In FIG. 9A, the standard deviation σ and the range of the film thickness were correlated with the deceleration $\alpha_1$ applied to stop the rotation of the substrate 10 according to FIG. 3 and TABLE 1 and the dispense amount of the resist. In this case, the deceleration $\alpha_1$ applied to stop the substrate's rotation was set to 25000 rpm/sec, 30000 rpm/sec, 40000 rpm/sec, and 50000 rpm/sec, respectively.

By contrast in FIG. 9B, the standard deviation σ and the range of the film thickness were correlated with the deceleration $\alpha_2$ to decelerate the rotation of the substrate to the second rotation speed $R_{22}$ and the dispense amount of the resist. Meanwhile, after ceasing the dispensing of the resist, the rotation speed of the substrate 10 was decelerated from the first rotation speed $R_{21}$ to 100 rpm as the second rotation speed $R_{22}$ by the deceleration $\alpha_2$ of 25000 rpm/sec, 30000 rpm/sec, 40000 rpm/sec, and 50000 rpm/sec, respectively.

Next, FIG. 9A is compared with FIG. 9B. The steps in TABLE 1 that stop the rotation of the substrate 10 after dispensing the resist result in a smaller standard deviation σ and narrower range of the resist film thickness than the result of using the steps in TABLE 2 where the substrate 10 is decelerated, not stopped, after dispensing the resist, when the deceleration $\alpha_1$ and $\alpha_2$ applied to stop or decelerate the rotation of the substrate 10 are 50000 rpm/sec and 40000 rpm/sec, respectively.

In FIG. 9B, the standard deviation σ and the range of the film thickness become small and a positive result of comparative values is achieved when the rotation of the substrate 10 is decelerated to 100 rpm at the deceleration rate of 30000 rpm/sec.

However, in this case in FIG. 9B, the standard deviation σ and the range of the film thickness were not both at their smallest values at the same time in their $\alpha_2$ row of FIG. 9B, when the rotation of the substrate 10 was decelerated to 100 rpm at the deceleration rate of 30000 rpm/sec (see 2.7/15.1 and 3.1/10.7 values in FIG. 9B). By contrast, when the rotation of the substrate 10 was stopped using the deceleration rate of 40000 rpm/sec or 50000 rpm/sec, both the standard deviation σ and the range of the film thickness were at their smallest values at the same time. Additionally, using the Reference conditions to decelerate the rotation of the substrate to 100 rpm at the deceleration rate of 30000 rpm/sec is less able to achieve the target resist film thickness than using the present embodiment of the improved method.

When the rotation of the substrate 10 is stopped by applying a deceleration $\alpha_1$ larger than 30000 rpm/sec to the substrate 10 to which the resist is supplied, the following may explain why such a method results in lower amount of the resist (for example, 70%), an improvement in the flatness of the resist film, and the ability to make resist films at or near the target film thickness.

Because of the effect of improving the lubricity of the resist by the thinner and the fluidity and inertia of the resist liquid itself, the resist liquid dispensed onto the center of the substrate 10 from the resist nozzle 21 spreads in a circumferential direction of the rotating substrate 10. Owing to a centrifugal force of the rotation of the substrate 10, the resist moves outwardly away from the center and scatters to the outside.

Meanwhile, friction is produced between the substrate 10 and the resist by the viscosity of the resist, so that as time passes from the dispensing of the resist onto the substrate 10, the spreading of the resist liquid in the circumferential direction is lowered.

In contrast, when the rotation of the substrate 10 is stopped immediately after the stopping the dispensation of the resist from the resist nozzle 21, the resist over the substrate 10 moves in a circumferential direction due to the inertia applied by the first rotational movement.

However, the resist liquid is not sufficiently spread merely by reducing the rotation speed to almost 100 rpm after the first rotation. The very large inertia energy in the circumferential direction can be applied to the resist by stopping the substrate at a deceleration rate larger than 30000 rpm/sec.

The amount of resist flowing over the surface of the substrate 10 is increased by a large inertia energy. Thus, unevenness of the surface of the resist film is reduced and the flatness of the resist film surface is enhanced. As a result, it is believed that the amount of resist scattered to the outside of the substrate 10 is further increased, so that the film thickness of the resist over the substrate 10 can be adjusted to a value near the target thickness.

Therefore, it is believed that the sudden stopping of the rotation of the substrate 10 improves the flatness of the resist film over the substrate 10 and also optimizes the film thickness of the resist, so that the film thickness of the resist may finally be adjusted by a subsequent second rotation speed $R_{12}$ of the substrate 10.

Having stated the above, in order to reduce the amount of the i-line resist dispensed, improve the flatness of the i-line resist film, and increase the precision of the i-line resist film thickness, it is understood that it is desirable for the coating conditions to quickly stop the rotation of the substrate 10 at a deceleration $\alpha_1$ larger than 30000 rpm/sec.

In this case, the adjustment of the dispense amount of the resist liquid shown in FIGS. 4, 5, 7, 8 and 9 is preferably made by changing the amount of dispensation of the resist per hour without changing the dispensation time of the resist liquid from the resist nozzle 21. Such adjustment of a dispensation amount of the resist is made similarly in following Examples.

Second Example

The resist used in the Second Example was the KrF resist that is manufactured by Tokyo Ohka Kogyo Co. Ltd. and has a viscosity of about 15 mPa·s. This KrF resist was dispensed onto a substrate 10 of 200 nm diameter. The dispense amount of KrF resist is set to 1.0 ml typically to keep the thickness of the resist film within permissible limits when a target thickness of KrF resist is set at 730 nm over the substrate 10 of 200 mm diameter.

The KrF resist was coated onto the substrate 10 by controlling the dispensing of the thinner, the dispensing of the KrF resist, and the rotation speed of the substrate 10 in compliance with the timing chart shown in FIG. 3. Then the resist film thickness distributions were measured. In addition, a bare silicon substrate was used as the substrate 10.

TABLE 3 shows an example of the steps for forming a resist coating based on rotation speeds, acceleration, elapsed times, timing of the solvent supply, and timing of the resist supply in TABLE 3, when the rotation of the substrate 10 is stopped by decelerating the substrate 10 by more than 30000 rpm/sec according to the timing chart shown in FIG. 3.

TABLE 3

| Step No. | Time (sec) | Rotation Speed (rpm) | Acceleration (rpm/sec) | Dispensed Liquid |
|---|---|---|---|---|
| 1 | 1.5 | 0 | | thinner |
| 2 | 1.0 | 0 | | |
| 3 | 0.1 | 1000 | 10000 | |
| 4 | 1.8 | ($R_{11}$) 4200 | 10000 | resist |
| 5 | 1.5 | 0 | -(larger than 30000) | |
| 6 | 20 | ($R_{12}$) 2800 | 10000 | |

* Resist viscosity: about 15 mPa·s

The dispensing of the thinner, the dispensing of the KrF resist, and the rotation speed of the substrate 10 were controlled in compliance with the steps shown in TABLE 3, and then the resist film thickness distributions were measured.

Here, the deceleration for stopping the rotation of the substrate 10 after stopping the dispensing of the resist to the substrate 10 is set to 40000 rpm/sec, for example. Additionally, a dispense amount of the resist was varied to different amounts: 90% (0.9 ml), 80% (0.8 ml), 70% (0.7 ml), and 50% (0.5 ml) respectively, where 1.0 ml was set to 100%. Then, the thickness distribution of the resist film was examined in each of these respective cases, and the result is shown in FIG. 10.

Figure 10:
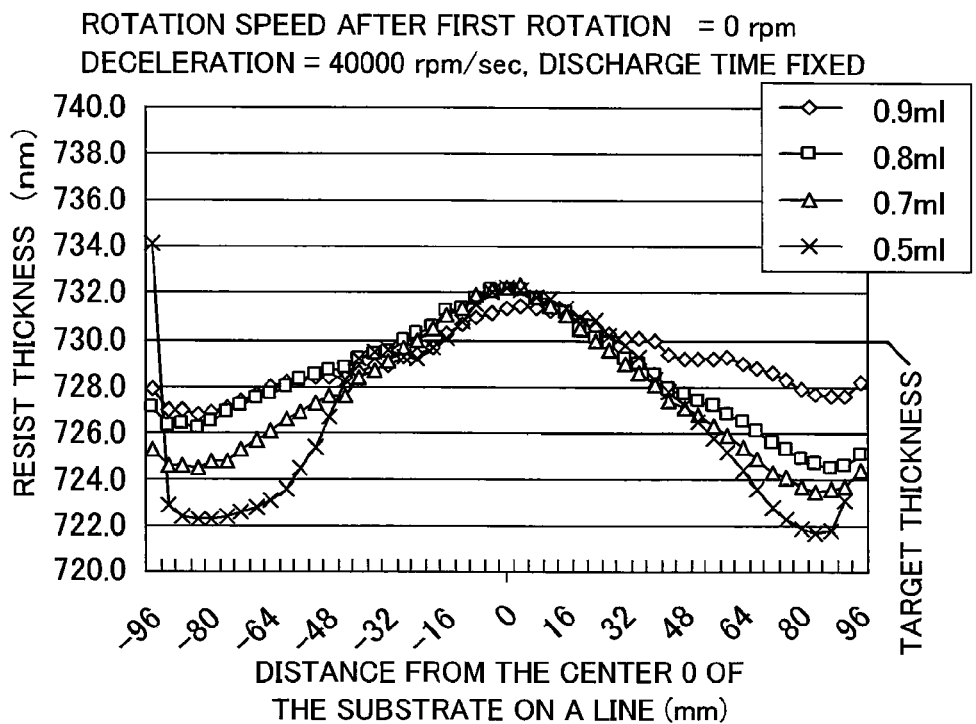
FIG. 10 is a graph showing the film thickness distributions of a KrF resist formed by a method for forming a coating with a coating liquid using the Second Example conditions, according to an embodiment of the present invention.

As shown in FIG. 10, when a dispense amount of the resist is set to a range of 90% to 70%, the maximum value of the resist film thickness distribution in the center portion and its nearby areas of the substrate 10 was found to be about 732 nm, about 2 nm thicker than the target thickness at the center of the substrate 10.

Figure 11:
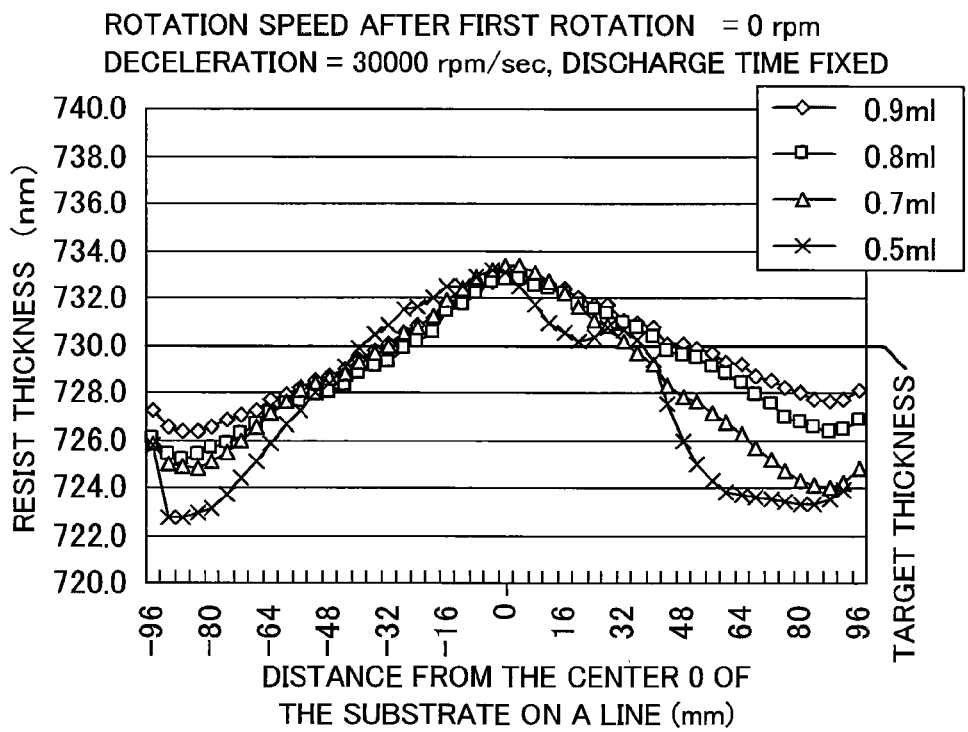
FIG. 11 is a graph showing the film thickness distributions of a KrF resist formed by a method for forming a coating with a coating liquid including the step of stopping the substrate by decelerating the substrate at 30,000 rpm/sec.

When the rotation of the substrate 10 was stopped by decelerating the substrate at 30000 rpm/sec at the end of the first rotation speed, the film thickness distributions of the KrF resist shown in FIG. 11 were obtained. The film thickness is 3.5 nm thicker than the target thickness at the center of the substrate 10.

The film thickness shown in FIG. 10 is closer to the target thickness than the film thickness shown in FIG. 11. When one compares FIGS. 10 and 11, the film thickness distribution shown in FIG. 10 is distributed closer to the target thickness.

Increasing the deceleration to over 30000 rpm/sec to stop the rotation of the substrate 10 gets even closer to the target film thickness.

FIG. 6 shows the timing chart used as an example of Reference conditions for comparison to an embodiment of the improved method. TABLE 4 shows an example of Reference conditions whose steps are based on rotation speeds, acceleration rate, elapsed times, timing of solvent supply, and timing of KrF resist supply provided in TABLE 4.

TABLE 4

| Step No. | Time (sec) | Rotation Speed (rpm) | Acceleration (rpm/sec) | Dispensed Liquid |
|---|---|---|---|---|
| 1 | 1.5 | 0 | | thinner |
| 2 | 1.0 | 0 | | |
| 3 | 0.1 | 1000 | 10000 | |
| 4 | 1.8 | ($R_{21}$) 4200 | 10000 | resist |
| 5 | 1.5 | ($R_{22}$) 100 | −50000 | |
| 6 | 20 | ($R_{23}$) 2800 | 10000 | |

* Resist viscosity: about 15 mPa·s

The flatness of the film thickness distribution was further examined in compliance with the steps shown in TABLES 3 and 4 while differentiating the results based on varying the dispense amount of the resist as well as varying the acceleration of the substrate after the end of dispensing of the resist respectively. Then, a standard deviation σ and a range, i.e., between the maximum value and the minimum value of the film thickness as a measure of flatness were examined. The results are shown in FIGS. 12A and 12B.

FIG. 12A shows the flatness of the resist film formed in compliance with the steps shown in TABLE 3. The standard deviation σ and the range of the film thicknesses were given to correlate with the deceleration $\alpha_1$ applied to stop the substrate 10 and a dispense amount of the resist. In this case, the deceleration $\alpha_1$ applied to stop the substrate was set to 25000 rpm/sec, 30000 rpm/sec, 40000 rpm/sec, and 50000 rpm/sec respectively. A dispense amount of the resist was varied to be 90%, 80%, 70%, and 50% respectively, where 1.0 ml was set to 100%.

By contrast, FIG. 12B shows the flatness of the resist film formed in compliance with the steps shown in TABLE 4. The standard deviation σ and the range of the film thicknesses were given to correlate with the deceleration $\alpha_2$ applied to decelerate the substrate 10 to the second rotation speed $R_{22}$ and the dispense amount of the resist.

Here, the rotation speed of the substrate 10 was decelerated from 4200 rpm as the first rotation speed $R_{21}$ to 100 rpm as the second rotation speed $R_{22}$. The deceleration $\alpha_2$ to decelerate the second rotation speed $R_{22}$ to 100 rpm was set to 50000 rpm/sec. The dispense amount of the resist was 1.0 ml (100%).

Next, FIG. 12A is compared with FIG. 12B. The steps shown in FIG. 12A in which the substrate 10 is stopped after dispensing the resist result in a smaller standard deviation σ and a smaller range of the film thicknesses than those for the Reference conditions shown in FIG. 12B, when the deceleration $\alpha_1$ applied to stop the rotation of the substrate 10 was set to 50000 rpm/sec and 40000 rpm/sec respectively, even if the dispense amount of the resist is reduced to 90%.

Based on the above analysis, in order to reduce the dispense amount of the KrF resist, improve the flatness of the KrF resist film, and increase the precision of the KrF resist thickness, it is preferable to stop the rotation of the substrate 10 by using a deceleration $\alpha_1$ larger than 30000 rpm/sec, for the same reasons given for the First Example.

Third Example

The resist used in the Third Example was the ArF resist that is manufactured by Tokyo Ohka Kogyo Co. Ltd. and has a viscosity of about 2 mPa·s. This ArF resist is dispensed onto a substrate 10 having a 200 nm diameter. The dispense amount of the ArF resist was set to 1.0 ml typically to keep the thickness of the resist within permissible limits when a target thickness of the KrF resist film is set at 250 nm over the substrate 10 having a diameter of 200 mm.

The resist film was formed by controlling the dispensing of the thinner, the dispensing of the ArF resist, and the rotation speed of the substrate 10 in compliance with the timing chart shown in FIG. 3. Then, resist film thickness distributions were measured. In addition, a bare silicon substrate was used as the substrate 10.

TABLE 5 shows example steps of forming a resist coating based over the rotation speeds, acceleration rates, elapsed times, timing of the solvent supply, and timing of the resist supply shown in TABLE 5, when the rotation of the substrate 10 is stopped by decelerating the substrate 10 by more than 30000 rpm/sec according to the timing chart shown in FIG. 3.

TABLE 5

| Step No. | Time (sec) | Rotation Speed (rpm) | Acceleration (rpm/sec) | Dispensed Liquid |
|---|---|---|---|---|
| 1 | 1.5 | 0 | | thinner |
| 2 | 1.0 | 0 | | |
| 3 | 0.1 | 500 | 10000 | |
| 4 | 1.0 | ($R_{11}$) 3000 | 10000 | resist |
| 5 | 1.5 | 0 | -(larger than 30000) | |
| 6 | 20 | ($R_{12}$) 2900 | 10000 | |

* Resist viscosity: about 2 mPa·s

The dispensing of the thinner, the dispensing of the ArF resist, and the rotation speed of the substrate 10 were controlled in compliance with the steps shown in Table 5. Then, the resist film thickness distributions were measured.

Here, the deceleration for stopping the rotation of the substrate 10 after stopping the dispensing of the resist to the substrate 10 was set to 40000 rpm/sec, for example. Additionally, the dispense amount of the resist was varied to 90% (0.9 ml), 80% (0.8 ml), 70% (0.7 ml), and 50% (0.5 ml), respectively, where 1.0 ml was set to 100%. Then, the thickness distribution of the ArF resist film was examined in each of these respective cases, and the results are shown in FIG. 13.

Figure 13:
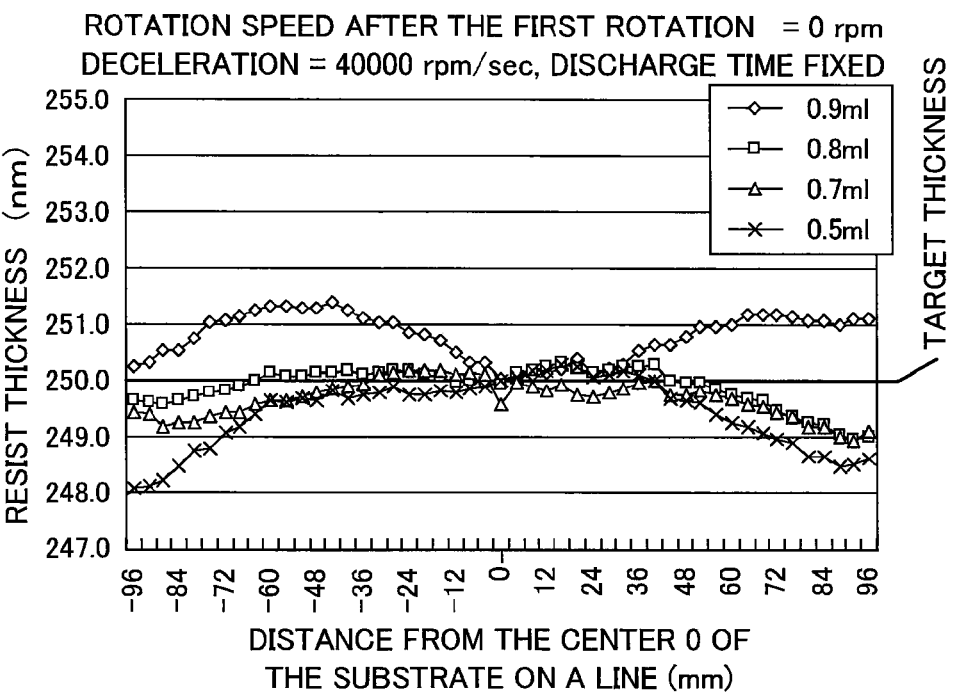
FIG. 13 is a graph showing film thickness distributions of an ArF resist formed by a method for forming a coating with a coating liquid using the Third Example conditions, according to an embodiment of the present invention.

As shown in FIG. 13, when the dispense amount of the ArF resist is set within a range of 90% to 70%, the resist film thickness distribution in the center portion of the substrate 10 has achieved the target thickness of 250 nm. When a dispense amount of the ArF resist is set to 80% and 70%, respectively, the resist film thickness distribution in around the center portion of the substrate 10 has achieved the target thickness.

Figure 14:
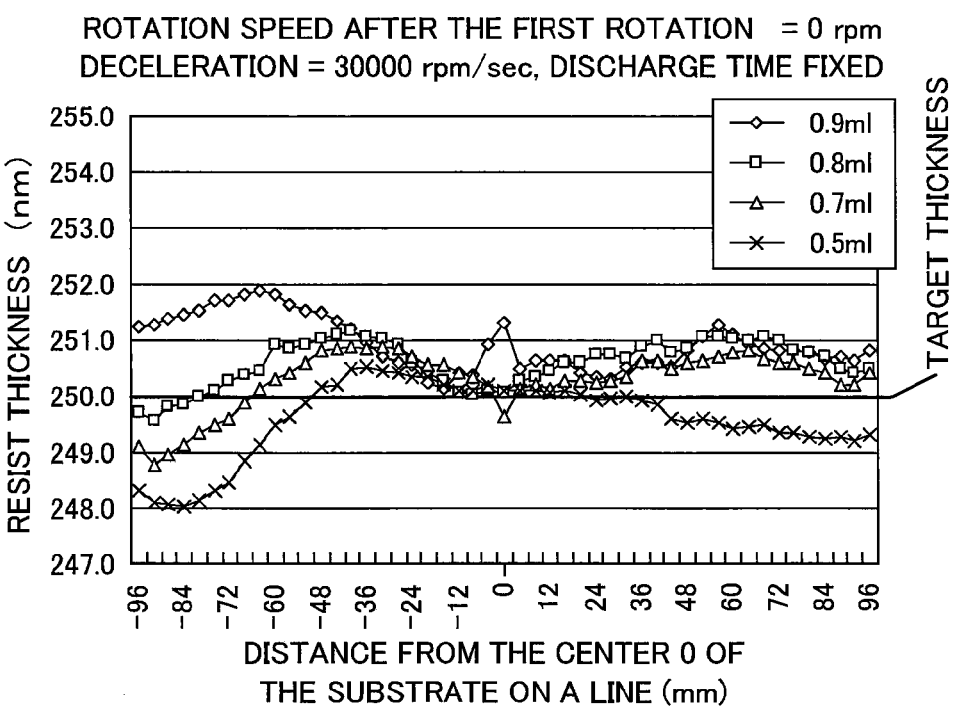
FIG. 14 is a graph showing film thickness distributions of an ArF resist formed by a method for forming a coating with a coating liquid including the step of stopping the substrate by decelerating the substrate at 30,000 rpm/sec.

When the rotation of the substrate 10 was stopped by decelerating the first rotation speed to zero at a rate of 30000 rpm/sec, the thickness distributions of the ArF resist film shown in FIG. 14 were obtained. The film thickness was approximately consistent with the target thickness. The film thickness was thicker by 0.5 nm to 1.0 nm than the target thickness at the center of the substrate.

When one compares FIGS. 13 and 14, the film thickness shown in FIG. 13 is closer to the target thickness than that shown in FIG. 14.

Increasing the deceleration to over 30000 rpm/sec to stop the rotation of the substrate 10 achieves a film thickness closer to the target film thickness, when the timing chart employs a step of stopping the rotation of the substrate.

As Reference conditions to an embodiment of the improved method, the timing chart shown in FIG. 6 was employed. TABLE 6 shows example steps for such Reference conditions based on the rotation speeds, acceleration rates, elapsed times, timing of the solvent supply, and timing of the ArF resist supply shown in TABLE 6.

TABLE 6

| Step No. | Time (sec) | Rotation Speed (rpm) | Acceleration (rpm/sec) | Dispensed Liquid |
|---|---|---|---|---|
| 1 | 1.5 | 0 | | thinner |
| 2 | 1.0 | 0 | | |
| 3 | 0.1 | 500 | 10000 | |
| 4 | 1.8 | ($R_{21}$) 3050 | 10000 | resist |
| 5 | 1.5 | ($R_{22}$) 100 | −30000 −40000, −50000 | |
| 6 | 20 | ($R_{23}$) 2900 | 10000 | |

* Resist viscosity: about 2 mPa · s

First, in the timing chart for the Reference conditions shown in TABLE 6, the deceleration was set to 30000 rpm/sec and 40000 rpm/sec respectively, when the rotation speed of the substrate 10 was decelerated from the first rotation speed $R_{21}$ to the second rotation speed $R_{22}$, i.e., 100 rpm. Additionally, the dispense amount of the resist was varied to be 90% (0.9 ml), 80% (0.8 ml), 70% (0.7 ml), and 50% (0.5 ml) respectively, where 1.0 ml was set to 100%. Then, the thickness distribution of the resist film was examined in each of these respective cases, and the results are shown in FIGS. 15 and 16.

Figure 15:
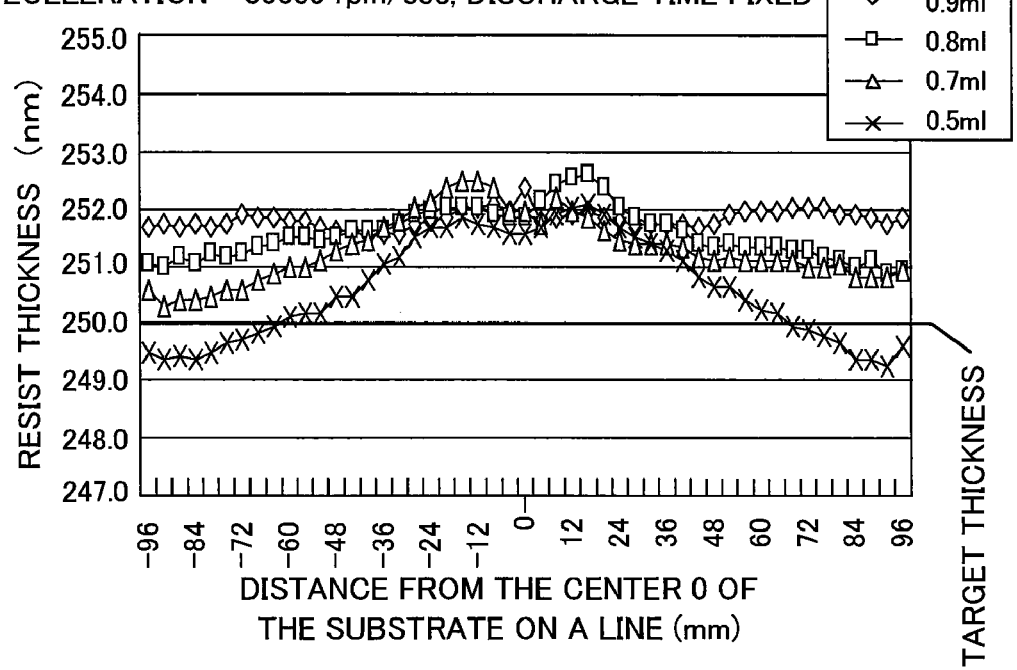
FIG. 15 is a graph showing the first film thickness distributions of an ArF resist formed by a method for forming a coating with a coating liquid according to the timing chart shown in FIG. 6.
Figure 16:
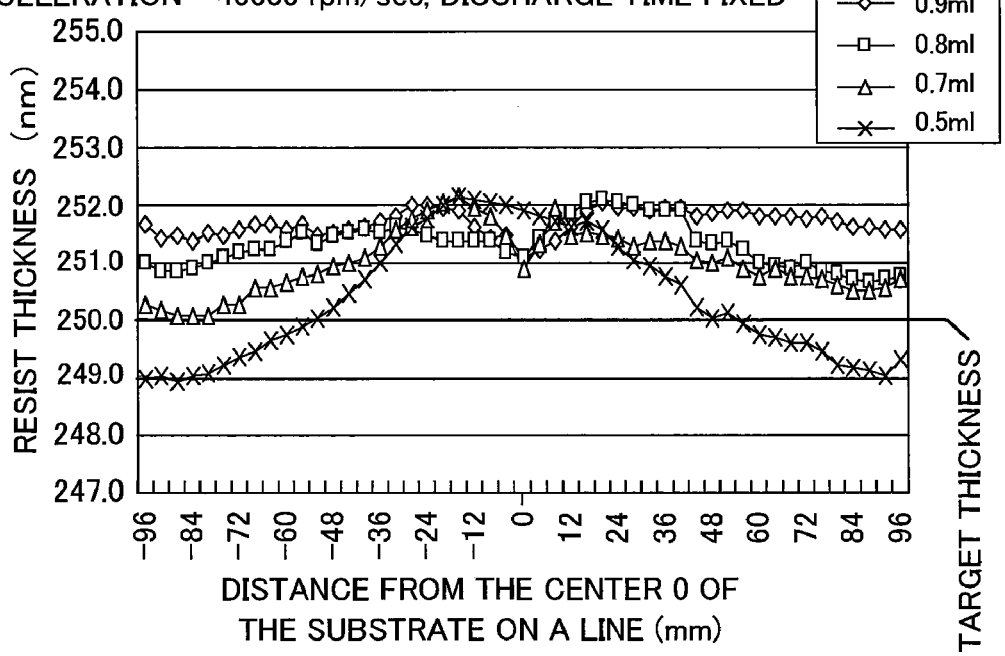
FIG. 16 is a graph showing the second film thickness distributions of an ArF resist formed by a coating liquid method using the timing chart shown in FIG. 6.

Using the Reference conditions, the thickness of the resist film formed in the center portion and its nearby areas of the substrate 10 as shown in FIG. 15 and FIG. 16 was thicker than the target thickness by about 1.0 nm to 2.0 nm. Therefore, the thickness of the resist film formed by the step of stopping the substrate 10 after the first rotation speed is closer to the target film thickness than the thickness of the resist film formed when the method does not stop the substrate 10 after the first rotation speed.

In addition, the film thickness distributions were further examined in compliance with the steps shown in TABLES 5 and 6 while varying the dispense amount of the resist as well as varying the deceleration of the substrate 10 after the end of the dispensing of the resist. Then, a standard deviation σ and a range of the film thickness as a measure of flatness were examined. The results shown in FIGS. 17A and 17B were obtained.

FIG. 17A shows the flatness of the resist film formed in compliance with the steps shown in TABLE 5. The standard deviation σ and the range of the film thicknesses were correlated with the deceleration $\alpha_1$ applied to stop the rotation of the substrate 10 and a dispense amount of the resist. In various test cases, the deceleration $\alpha_1$ applied to stop the substrate was varied to be 25000 rpm/sec, 30000 rpm/sec, 40000 rpm/sec, and 50000 rpm/sec, respectively. The dispense amount of the resist was varied to 90%, 80%, 70%, and 50%, where 1.0 ml was set to 100 W.

On the other hand, FIG. 17B shows the flatness of the resist film formed in compliance with the steps shown in TABLE 6. The standard deviation σ and the range of the film thicknesses were correlated with different decelerations $\alpha_2$ applied to decelerate the rotation of the substrate 10 to the second rotation speed $R_{22}$ as well as different dispense amounts of the resist.

Here, the rotation speed of the substrate 10 was decelerated from 3000 rpm as the first rotation speed $R_{21}$ to 100 rpm as the second rotation speed $R_{22}$. The deceleration $\alpha_2$ to decelerate the second rotation speed $R_{22}$ to 100 rpm was set to and 50000 rpm/sec. The dispense amount of the resist was 1.0 ml.

Next, FIG. 17A is compared with FIG. 17B. The steps used for FIG. 17A in which the substrate 10 is stopped after supplying the resist result in a smaller standard deviation σ and tighter range of film thicknesses than the standard deviation and range of film thicknesses resulting from the Reference conditions used for FIG. 17B, when the deceleration $\alpha_1$ applied to stop the rotation of the substrate 10 was set to 50000 rpm/sec, even if the dispense amount of the resist was reduced to 90%.

In addition, the steps used for FIG. 17A result in both the standard deviation σ and the range of the film thicknesses being smaller than that of the Reference conditions used for FIG. 17B, when the deceleration $\alpha_1$ was set to 40000 rpm/sec, even if the dispense amount of the resist was reduced to 70%.

In order to reduce the dispense amount of the ArF resist, improve the flatness of the ArF resist, and increase the precision of the ArF resist film thickness, it is understood that it is preferable to stop the rotation of the substrate 10 at a deceleration $\alpha_1$ larger than 30000 rpm/sec, for the same reasons provided for the First Example.

In the First, Second and Third Example embodiments of the improved method, the relationship between the stop time of the substrate after dispensing the resist and the resist film thickness distribution is explained below.

Figure 18:
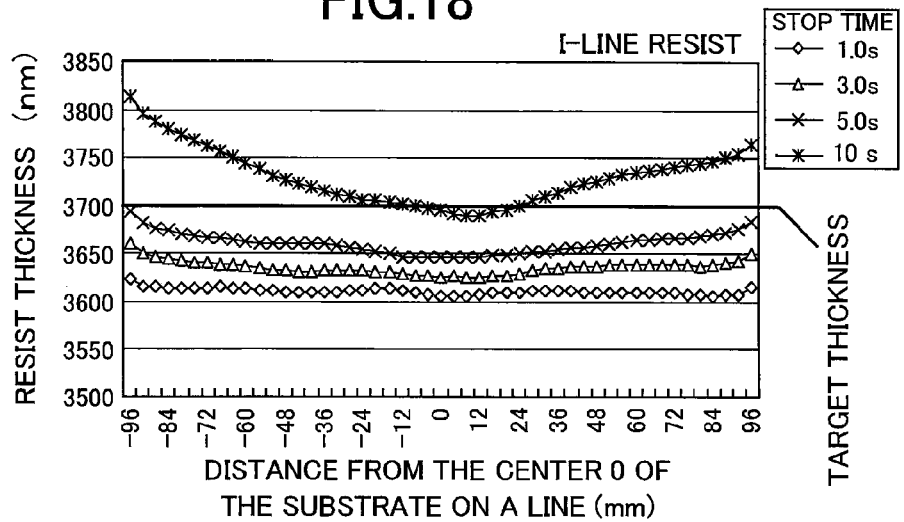
FIG. 18 is a graph showing stop-time-dependent film thickness distributions of an i-line resist formed by a method for forming a coating with a coating liquid using the First Example conditions, according to an embodiment of the present invention.

In the coating step of the i-line resist in the First Example embodiment of the improved method, the resist film thickness distributions changes depending on the time duration that the substrate is stopped (e.g., 1.5 seconds, 3.0 seconds, 5.0 seconds, and 10 seconds respectively), after dispensing the resist according to the experiment shown in FIG. 18.

Figure 19:
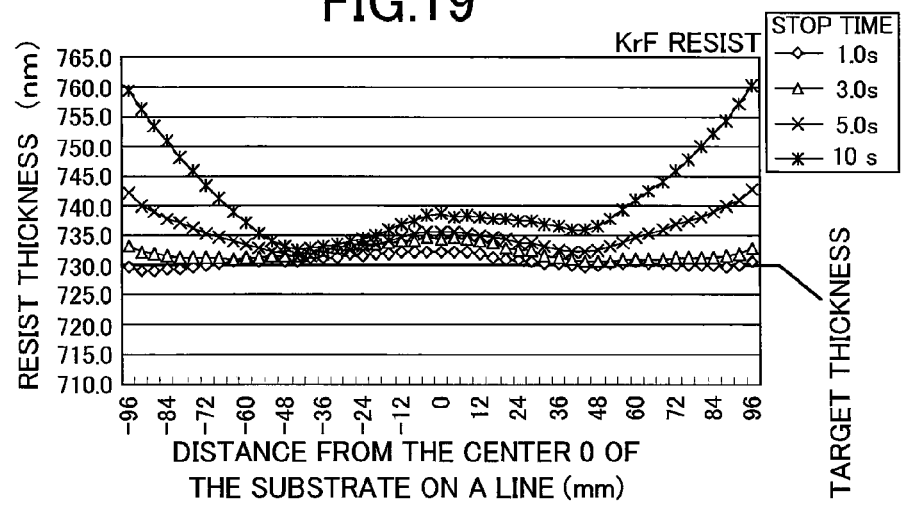
FIG. 19 is a graph showing stop-time-dependent film thickness distributions of a KrF resist formed by a method for forming a coating with a coating liquid using the Second Example conditions, according to an embodiment of the present invention.
Figure 20:
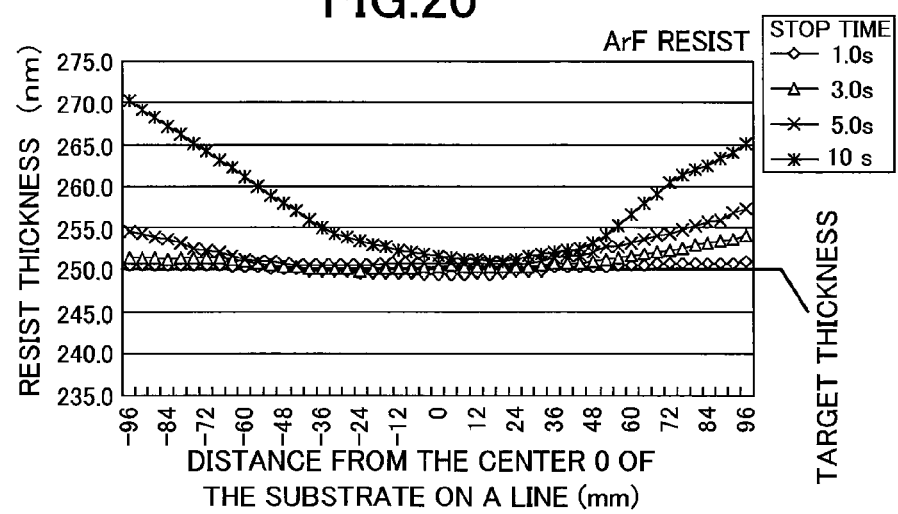
FIG. 20 is a graph showing stop-time-dependent film thickness distributions of an ArF resist formed by a method for forming a coating with a coating liquid using the Third Example conditions, according to an embodiment of the present invention.

The thickness distributions of the KrF resist film used in the Second Example and the ArF resist used in the Third Example were measured after forming the resist film under conditions whose stop time of the substrate 10 was set to the values shown in FIGS. 19 and 20, respectively.

As shown in FIGS. 18, 19 and 20, an increase in the stop time increases the film thickness of the resulting resist film in the periphery portion of the substrate 10, which increases the warping of the resist film. After dispensing the resist, the time period during which the substrate is at a stop should be set shorter than 3.0 seconds so that the resist film is formed within a permitted value of ±1% of the target thickness, as shown in those resist thickness distributions.

On the other hand, when the stop time of the substrate 10 is set to be less than 0.5 seconds, the flatness of the resist film is inferior under each of the coating methods. The reason is described below.

When the stop time of the substrate 10 after dispensing the resist is shorter than 0.5 seconds, the resist spreads insufficiently along the circumferential direction of the substrate 10, thereby making the flatness of the resist film thickness uneven and inferior. On the other hand, when the stop time is longer than 3.0 seconds, the spreading of the resist is stopped completely over the substrate 10, thereby making it difficult for the resist to move over the substrate 10 at the start of the second rotation speed of the substrate 10.

As a result after the substrate 10 finishes the first rotation speed, it is preferable that the stop time period $T_0$ of the substrate 10 is set longer than 0.5 seconds but shorter than 3 seconds.

The amount of the resist dispensed is adjusted by changing the amount of dispensation of the resist per unit time and changing the time of dispensation of the resist per unit time. For example, when an amount of 0.8 ml of resist is supplied onto the substrate 10, the resist is dispensed from resist nozzle 21 in one second at 0.8 ml/sec, or in two seconds at 0.4 ml/sec, or other similar conditions.

Figure 21:
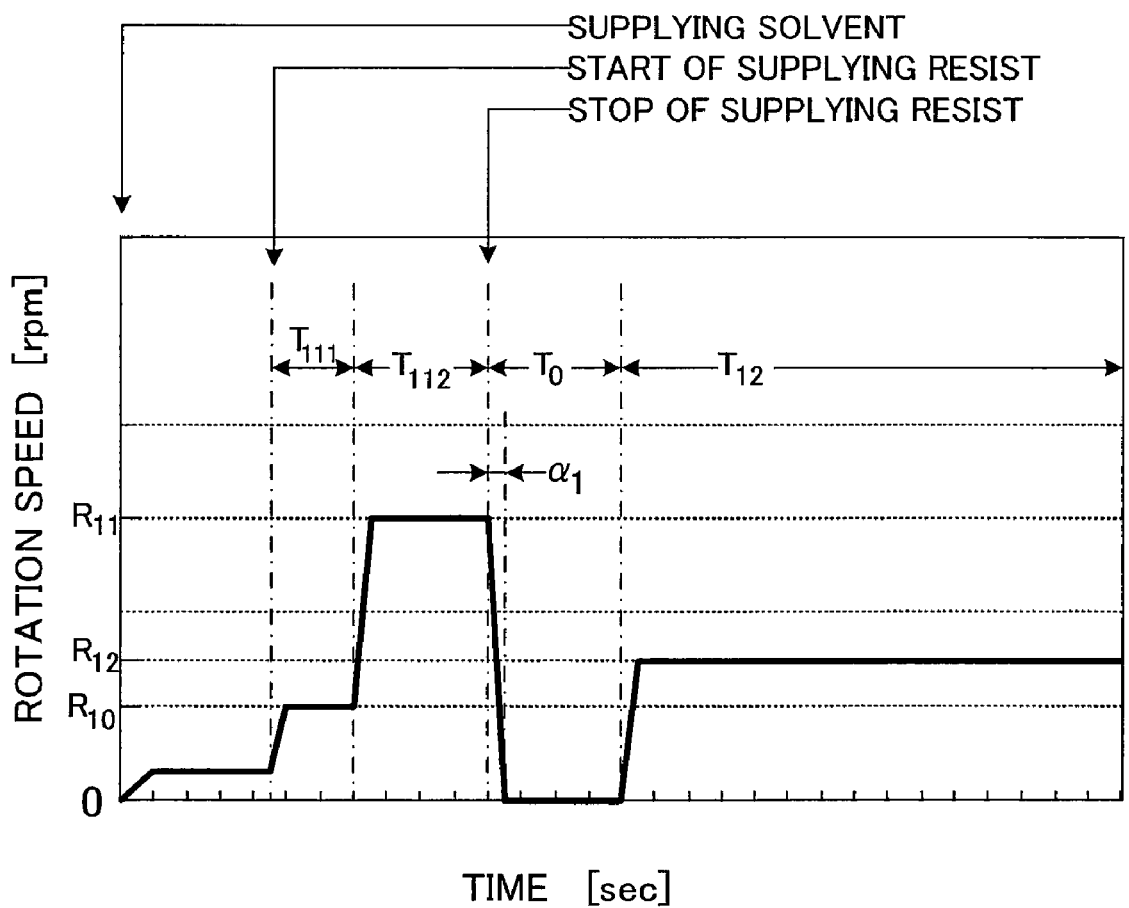
FIG. 21 is another example timing chart of the rotation speeds and time durations for rotating a substrate in the coating liquid method according to an embodiment of the present invention.

When a resist dispense amount per unit time from the resist nozzle 21 is set to a lower value, it is preferred that the timing chart steps up the rotation speed of the substrate 10 shown in FIG. 21, without spinning the substrate 10 at a high rotation speed such as 3000 rpm from the very beginning.

More specifically, the two sub-steps approach shown in FIG. 21 may be taken to reach the first rotation speed $R_{11}$ of the substrate 10, during which the resist is dispensed. For example, first, the substrate 10 is spun at a very low rotation speed, after which solvent is dispensed onto the substrate 10; second, the substrate 10 is spun at a higher but still a low speed, for example 1000 rpm, at the beginning of the time period $T_{111}$ of dispensing the resist, and then third, the substrate 10 is rotated at a higher speed, for example 3000 rpm, at the end of the time period $T_{112}$ of dispensing the resist. Therefore, the dispensing of the resist in the periphery portion of the substrate 10 is made stable, and the thickness of the resist film is formed even.

In FIG. 21, the timing of supplying the resist to the substrate 10 means the timing of the signal transmitted from the controlling portion 11 to the resist supplying portion 26. Therefore, the begging of supplying the resist liquid may be slightly delayed from the start of the time period $T_{111}$. In FIG. 21, the substrate 10 is rotated at a lower speed than 1000 rpm after the supply of the thinner. However, the substrate 10 may not be rotated before the resist supplying.

Next, example steps of manufacturing a semiconductor device that coats the resist film in compliance with the timing chart shown in FIG. 3 will be explained with reference to FIGS. 22A to 22P.

Figure 22A:
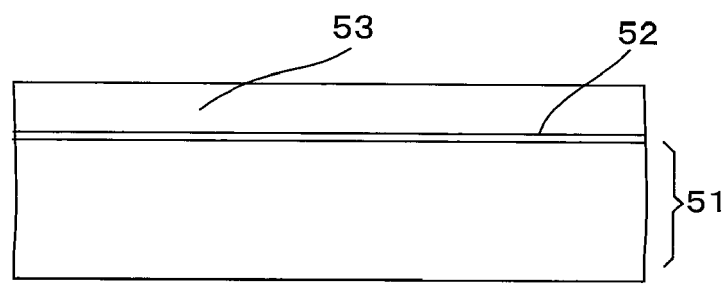
FIGS. 22A to 22P are cross-sectional views showing steps of manufacturing a semiconductor device according to an example method embodiment of the present invention.

First, as shown in FIG. 22A, a silicon nitride film ($SiN_x$ film) 52 is formed over a surface of a silicon substrate 51 serving as the substrate 10 through a silicon oxide film (not shown). Then, a solvent such as thinner is dispensed on the silicon nitride film 52 from the solvent nozzle 22, and an ArF resist 53 whose viscosity is 2.2 mPa·s is coated onto the silicon nitride film 52 from the resist nozzle 21. This coating of the resist film is performed under the conditions given in TABLE 5. Even when the dispense amount of the resist from the resist nozzle 21 is reduced smaller than 1.0 ml, as described above, a uniform film thickness distribution is obtained.

Figure 22B:
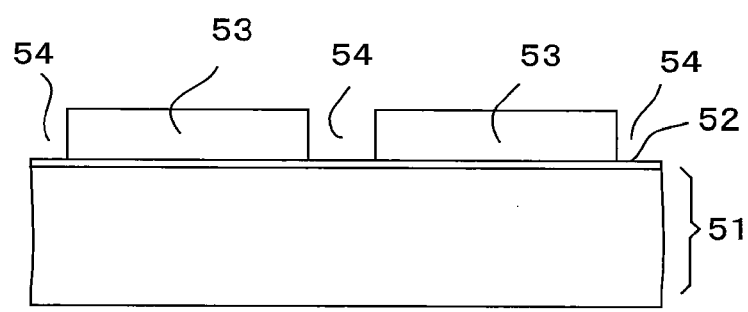
Figure 22C:
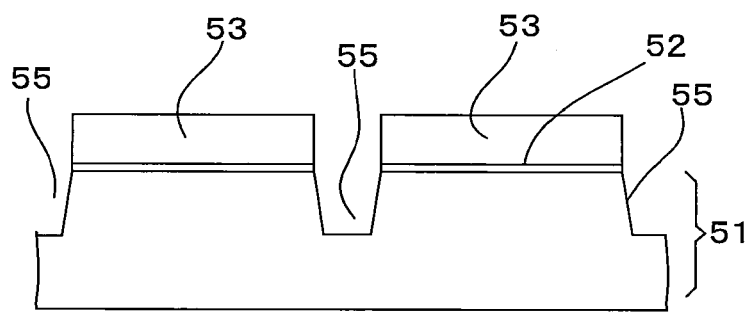

As shown in FIG. 22B, opening portions 54 are formed in shallow trench regions by exposing the ArF resist 53 over the silicon substrate 51 by using a light source having a wavelength of 193 nm, and developing the resist. Then, as shown in FIG. 22C, each of recesses 55 is formed by etching the silicon nitride film 52 and the silicon oxide film (not shown) exposed from opening portion 54, then the silicon substrate 51 is etched by means of a reactive ion etching process, after the ArF resist 53 is removed.

Figure 22D:
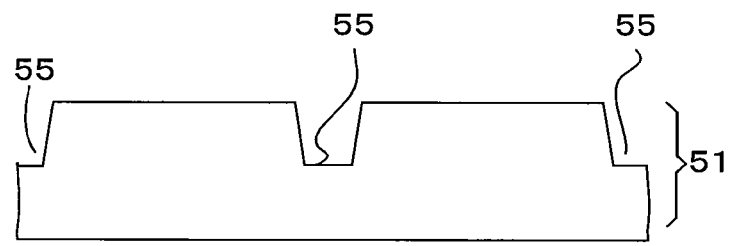
Figure 22E:
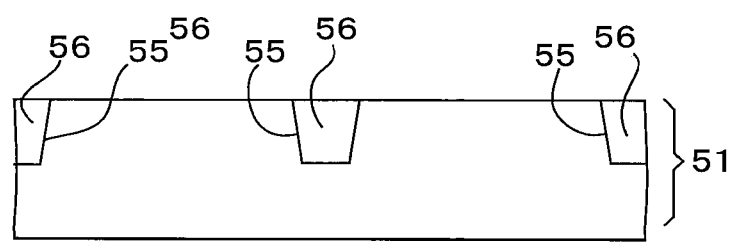

As shown in FIG. 22D, the ArF resist 53 is removed. As shown in FIG. 22E, a silicon oxide film is buried in the recesses 55 in the silicon substrate 51 and thus, shallow trench isolations 56 are formed. Here, after the silicon oxide film on the silicon nitride film 52, the silicon nitride film 52 formed over the silicon substrate 51 is removed by phosphoric acid, for example, and then the silicon oxide film under the silicon nitride film 52 is removed.

Figure 22F:
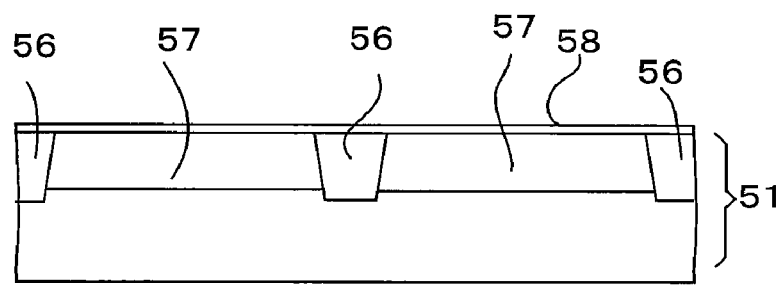

As shown in FIG. 22F, n-type or p-type wells 57 are formed by ion-implanting the impurity of either n-type or p-type into the silicon substrate 51. Then, a gate insulating film 58 is formed by thermally oxidizing the surface of the silicon substrate 51.

Figure 22G:
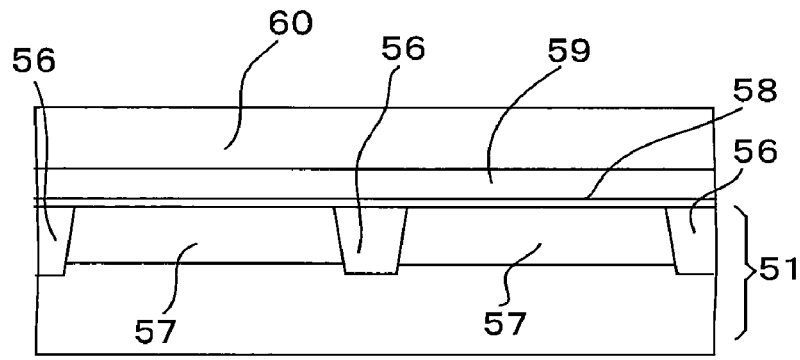
Figure 22H:
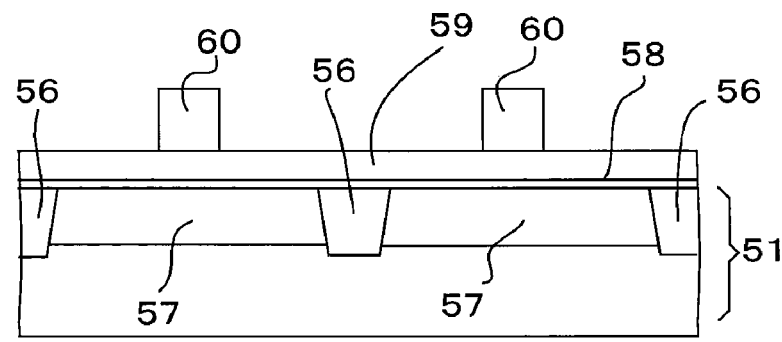
Figure 22I:
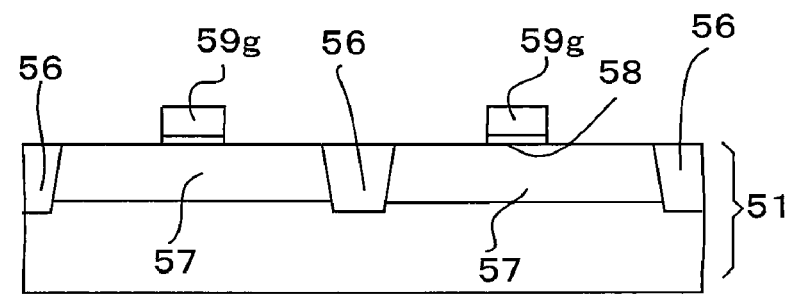

As shown in FIG. 22G, a polysilicon film 59 is formed on the gate insulating film 58. Then, a solvent is supplied onto the polysilicon film 59 by the method given in TABLE 5, and then an ArF resist 60 is coated thereon. As shown in FIG. 22H, gate patterns are formed by exposing/developing the ArF resist 60. The polysilicon film 59 is etched while using the patterned ArF resist 60 as a mask, and then the ArF resist 60 is removed. Accordingly, as shown in FIG. 22I, gate electrodes 59g formed of the polysilicon film 59 are formed over the wells 57 via the gate insulating film 58.

Figure 22J:
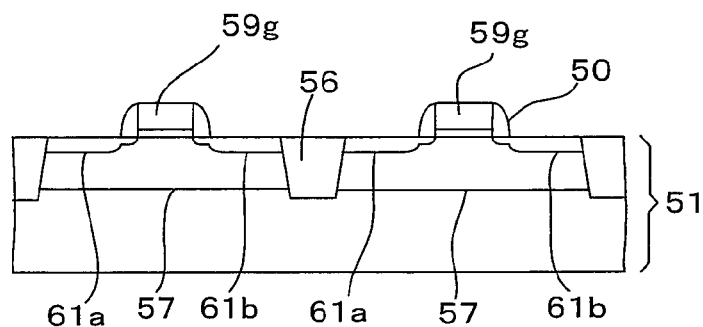

As shown in FIG. 22J, n-type or p-type impurity diffusion regions 61a, 61b acting the source/drains are formed in the silicon substrate 51 on both sides of the gate electrodes 59g. When the n-type or p-type impurity diffusion regions 61a, 61b are formed, the impurity ion-implanting step is done several more than once. An insulating sidewall 50 is formed on each of side-faces of the gate electrodes 59g between the ion-implanting steps. After an insulating film such as a silicon oxide film or the like is formed on the gate electrode 59g, the insulating sidewall 50 is formed by etching back the silicon oxide or the like.

Figure 22K:
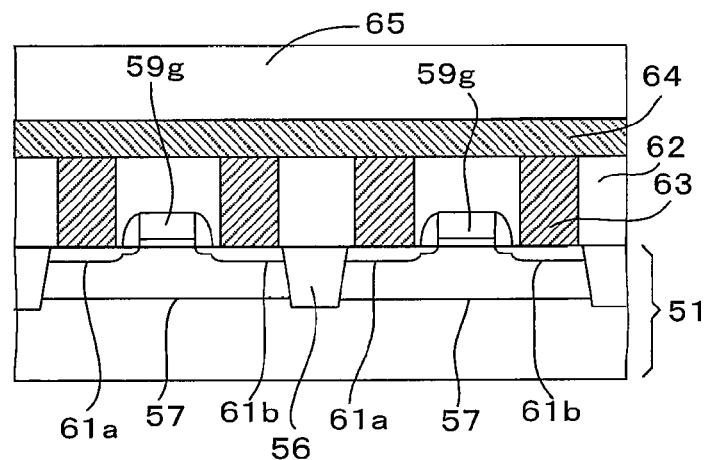

As shown in FIG. 22K, a silicon oxide film acting as a first-layer interlayer insulating film 62 is formed over the gate electrodes 59g and the silicon substrate 51 by a chemical vapor deposition (CVD) method. Conductive plugs 63 connected to the impurity diffusion regions 61a, 61b are formed in the first-layer interlayer insulating film 62.

Then, a conductive film 64 made of a tungsten is formed on the first-layer interlayer insulating film 62. A solvent is dispensed onto the conductive film 64, and then a KrF resist 65 is coated thereon. The KrF resist 65 is coated according to the conditions given in TABLE 3, for example.

Figure 22L:
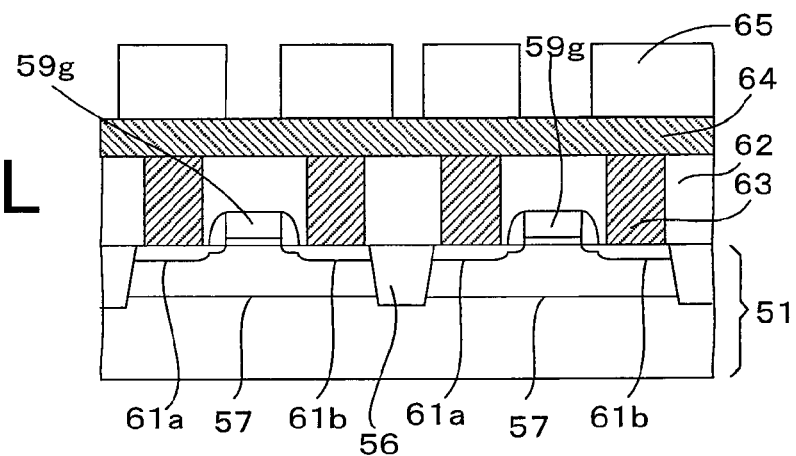
Figure 22M:
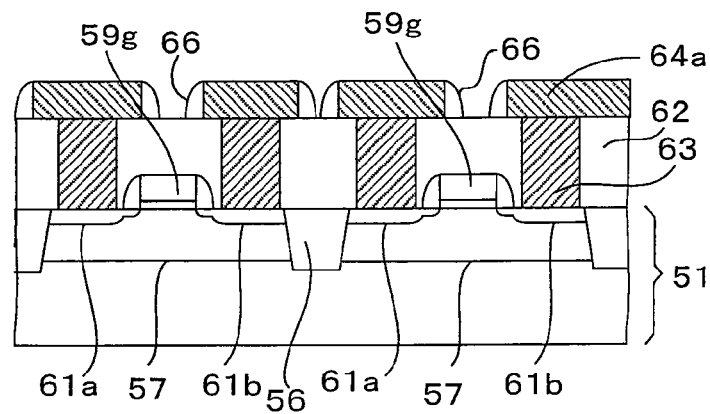

As shown in FIG. 22L, wiring patterns are formed by exposing/developing the KrF resist 65 while using a light source whose wavelength is 248 nm. As shown in FIG. 22M, the conductive film 64 is etched by using the patterns of the KrF resist 65 as a mask, and the remaining conductive film 64 constitutes first-layer wirings 64a. A silicon oxide film is formed on the wirings 64a and the first-layer interlayer insulating film 62, and then the insulating film 62 remains as a insulating side-wall 66 around the first-layer wirings 64a by etching back.

Figure 22N:
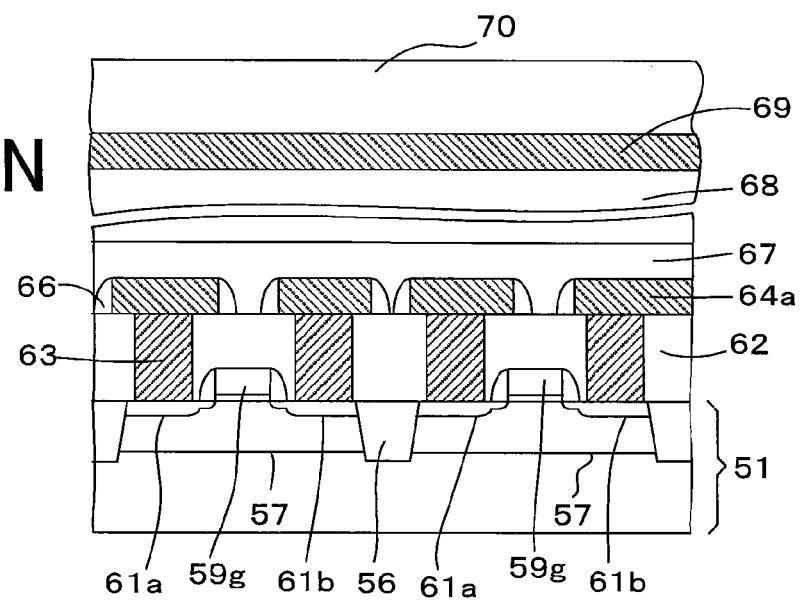

As shown in FIG. 22N, a second-layer interlayer insulating film 67, conductive plugs (not shown), wirings (not shown), and the like are formed. Then, an uppermost layer conductive film 69 made of an aluminum alloy is formed on an n-th-layer interlayer insulating film 68. Then, a solvent is coated on the uppermost layer conductive film 69 and then an i-line resist 70 is coated on the conductive film 69. The coating of the i-line resist 70 is executed according to the conditions given in TABLE 1, for example.

Figure 22O:
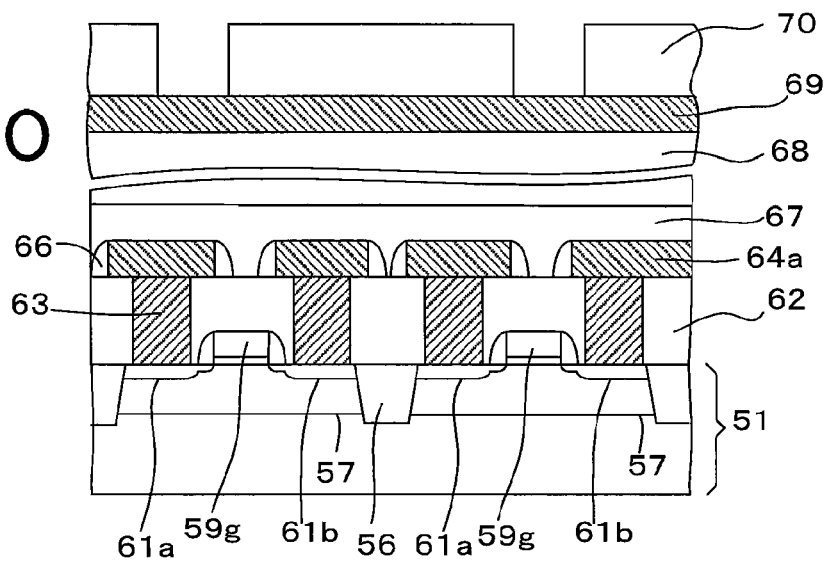

As shown in FIG. 22O, wiring patterns are formed by exposing the i-line resist 70 by using an exposure light source (not shown) whose wavelength is 365 nm, and then developing this resist.

Figure 22P:
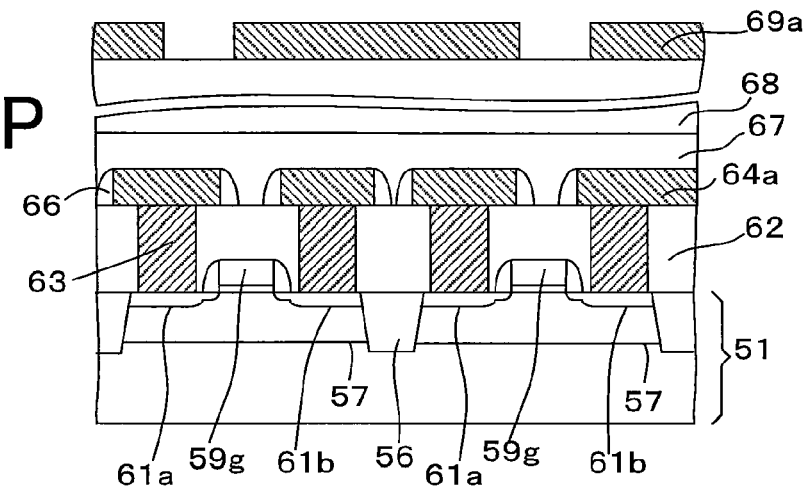

As shown in FIG. 22P, uppermost layer wirings 69a are formed by etching the uppermost layer conductive film 69 while using the patterned i-line resist 70 as a mask.

In this manner, an example semiconductor device may be formed by using the resists 53, 60, 65, 70 that are exposed by an optimum wavelength of exposure on a plurality of layers respectively.

According to the present embodiment of the improved method, the amount of resist used to form the plural resists 53, 60, 65, 70 can be reduced more than the prior art and the amount of consumption of the resist can be lowered.

In the above embodiment, an example method of coating a resist over the surface of the substrate is explained. However, the above coating method(s) may be applied to the case where the resist is coated over a photomask substrate or a LCD substrate. Also, the above coating methods are not limited to the case where the resist is coated over the substrate, and may be applied to the case where SOG (spin on glass), polyimide resin, or the like is coated over the substrate.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

What is claimed is:

1. A method of manufacturing a semiconductor device, the method comprising:
supplying a solvent to a surface of a substrate;
starting a supply of a coating liquid to the surface of the substrate while rotating the substrate at a first rotation speed, the substrate rotating at the first rotation speed for a first time period;
stopping the rotation of the substrate while keeping deceleration larger than 30000 rpm/second; and
after the substrate is stopped, rotating the substrate at a second rotation speed for a second time period.

2. The method of claim 1, further comprising:
stopping the rotation of the substrate after stopping the supplying of the coating liquid to the substrate.

3. The method of claim 1, further comprising:
changing the first rotation speed after the supply of the coating liquid to the substrate has started but before stopping the rotation of the substrate.

4. The method of claim 3, wherein the first rotation speed has a beginning speed and an ending speed, the ending speed being faster than the beginning speed.

5. The method of claim 1, wherein the deceleration is at least 40000 rpm/second.

6. The method of claim 5, wherein the second rotation speed is lower than the first rotation speed.

7. The method of claim 5, wherein in the stopping of the substrate, the substrate is stopped longer than 0.5 seconds but shorter than 3.0 seconds.

8. The method of claim 1, further comprising:
after supplying the solvent to the substrate and before rotating the substrate at the first rotation speed, spinning the substrate at a third rotation speed.

9. The method of claim 8, wherein the third rotation speed is lower than the first rotation speed.

10. The method of claim 9, wherein the second rotation speed is lower than the first rotation speed.

11. The method of claim 9, wherein in the stopping of the substrate, the substrate is stopped longer than 0.5 seconds but shorter than 3.0 seconds.

12. The method of claim 8, wherein the third rotation speed is in the range of 100 to 2500 rpm.

13. The method of claim 12, wherein the deceleration is at least 40000 rpm/second.

14. The method of claim 1, wherein the second rotation speed is lower than the first rotation speed.

15. The method of claim 1, wherein the second rotation speed is larger than the first rotation speed.

16. The method of claim 1, wherein in the stopping of the substrate, the substrate is stopped longer than 0.5 seconds but shorter than 3.0 seconds.

17. The method of claim 1, wherein the viscosity of the coating liquid is 25 mPa-seconds or less.

18. The method of claim 1, wherein the first rotation speed is in the range of 1000 to 3000 rpm.

19. The method of claim 18, wherein the second rotation speed is in the range of 1500 to 3000 rpm.

20. The method of claim 19, wherein the deceleration is at least 40000 rpm/second.

21. The method of claim 18, wherein the deceleration is at least 40000 rpm/second.

22. The method of claim 1, wherein the second rotation speed is in the range of 1500 to 3000 rpm.

23. The method of claim 22, wherein the deceleration is at least 40000 rpm/second.

24. The method of claim 1, wherein after the substrate is stopped, the substrate is accelerated to the second rotation speed by an acceleration of at least 5000 rpm/second.

25. The method of claim 1, further comprising:
dispensing the coating liquid onto the substrate before the substrate is rotating at the first rotation speed.

26. The method of claim 1, wherein the deceleration is larger than 30000 rpm/second during a deceleration time period.

27. The method of claim 1, wherein the deceleration is maintained constant during a deceleration period.

28. The method of claim 1, wherein the rotation of the substrate is decreased to 0 rpm from the first rotation speed by keeping the deceleration at larger than 30000 rpm/second.

29. A method of forming a coating, the method comprising:
supplying a solvent to a surface of a substrate;
starting a supply of a coating liquid to the surface of the substrate while rotating the substrate at a first rotation speed, the substrate rotating at the first rotation speed for a first time period;
stopping the rotation of the substrate while keeping deceleration larger than 30000 rpm/second; and
after the substrate is stopped, rotating the substrate at a second rotation speed for a second time period.

30. The method of claim 29, further comprising:
stopping the rotation of the substrate after stopping the supplying of the coating liquid to the substrate.

31. The method of claim 29, wherein the deceleration is at least 40000 rpm/second.

32. The method of claim 29, further comprising:
after supplying the solvent to the substrate and before rotating the substrate at the first rotation speed, spinning the substrate at a third rotation speed.

33. The method of claim 32, wherein the third rotation speed is lower than the first rotation speed.

34. The method of claim 29, wherein the second rotation speed is lower than the first rotation speed.

35. The method of claim 29, wherein in the stopping of the substrate, the substrate is stopped more than 0.5 seconds but less than 3.0 seconds.

36. The method of claim 29, wherein the deceleration is larger than 30000 rpm/second during a deceleration time period.

37. The method of claim 29, wherein the deceleration is maintained constant during a deceleration time period.

38. The method of claim 29, wherein the rotation of the substrate is determined to be 0 rpm from the first rotation speed by keeping the deceleration at larger than 30000 rpm/second.

39. A method of forming a coating, the method comprising:
dispensing a solvent to a surface of a substrate;
starting a supply of a coating liquid to the surface of the substrate while rotating the substrate at a first rotation speed, the substrate rotating at the first rotation speed for a first predetermined time;
rotating the substrate at a second rotation speed for a second predetermined time, the second rotation speed being larger than the first rotation speed;
dispensing the coating liquid on the substrate during the second rotation speed;
rotating the substrate at a third rotation speed for a third predetermined time, the third rotation speed being larger than the second rotation speed;
ending the dispensing of the coating liquid onto the substrate before the substrate spins at the third rotation speed;
stopping the rotation of the substrate at a deceleration larger than 30000 rpm/sec; and
after the substrate is stopped, rotating the semiconductor substrate at a fourth rotation speed for a fourth predetermined time.

* * * * *